United States Patent
Warner et al.

(10) Patent No.: US 12,147,736 B2
(45) Date of Patent: Nov. 19, 2024

(54) SYSTEM AND METHODS FOR 3D MODEL EVALUATION USING TRIANGLE MESH HASHING

(71) Applicant: Physna Inc., Columbus, OH (US)

(72) Inventors: Glenn Warner, Verona, KY (US); Paul Powers, New Richmond, OH (US)

(73) Assignee: Physna Inc., Columbus, OH (US)

( * ) Notice: Subject to any disclaimer, the term of this patent is extended or adjusted under 35 U.S.C. 154(b) by 274 days.

(21) Appl. No.: 17/821,439

(22) Filed: Aug. 22, 2022

(65) Prior Publication Data

US 2022/0405434 A1  Dec. 22, 2022

Related U.S. Application Data

(63) Continuation-in-part of application No. 16/611,790, filed as application No. PCT/US2018/031554 on May 8, 2018, now Pat. No. 11,422,531.

(60) Provisional application No. 62/502,865, filed on May 8, 2017.

(51) Int. Cl.
  *G06F 30/12* (2020.01)
  *G06F 30/10* (2020.01)
  *G06V 20/64* (2022.01)

(52) U.S. Cl.
  CPC .............. *G06F 30/12* (2020.01); *G06F 30/10* (2020.01); *G06V 20/64* (2022.01)

(58) Field of Classification Search
  None
  See application file for complete search history.

(56) References Cited

U.S. PATENT DOCUMENTS

| | | | |
|---|---|---|---|
| 2010/0149180 A1* | 6/2010 | Trotta | G06T 17/00 345/420 |
| 2016/0159012 A1* | 6/2016 | Lee | G05B 19/40937 700/98 |
| 2018/0036800 A1* | 2/2018 | Torabi | B33Y 10/00 |
| 2019/0299536 A1* | 10/2019 | Putman | B33Y 10/00 |

* cited by examiner

*Primary Examiner* — Saptarshi Mazumder
(74) *Attorney, Agent, or Firm* — Jenei LLC

(57) ABSTRACT

A method for comparing two or more three-dimensional (3D) object model by evaluating at least one 3D triangle from each received triangular mesh data. For each reference triangle, the method includes identifying one or more adjacent triangles using conditions for congruence of triangles and performing neighbor facet edge hashing to produce an object hash value for each of the at least one 3D triangle. The method includes comparing the object hash value to one or more reference hash values assigned respectively to one or more 3D object models. The method includes determining whether a match exists between one or more 3D object models and the reference object based upon an amount of matching of obtained hash values. In one or more embodiments, a method compares 3D triangle objects, such as a prior scan of the same object, to determine deviations over time or the subtraction or addition of sub-parts.

15 Claims, 15 Drawing Sheets

KeyC

Self    3X Adjacent

Key4

SYSTEM AND METHODS FOR 3D MODEL EVALUATION USING TRIANGLE MESH HASHING

CROSS-REFERENCE TO RELATED APPLICATIONS

This application is a continuation-in-part of U.S. application Ser. No. 16/611,790, filed Nov. 7, 2019, which is a national stage application, filed under 35 U.S.C. § 371, of International Patent Application No. PCT/US18/31554, entitled "SYSTEM AND METHODS FOR 3D MODEL EVALUATION", filed May 8, 2018, which claims the benefit to U.S. Patent Application Provisional Application Ser. No. 62/502,865 entitled "SYSTEM AND METHODS FOR 3D MODEL EVALUATION", filed May 8, 2017, the contents of which are hereby incorporated by reference in their entirety for any purpose.

BACKGROUND OF THE INVENTION

1. Field of the Invention

The field of art disclosed herein pertains to a three-dimensional data processing apparatus, a three-dimensional data processing method and a three-dimensional data processing program. More particularly, the present invention relates to an apparatus, a method or a program that has capabilities to search for an object similar to a predetermined shape from inputted three-dimensional shape models (e.g., computer-aided design (CAD) models or mesh models) and is able to change the search scope in terms of size and/or proportion.

2. Description of the Related Art

The present disclosure is directed, in general, to computer aided design, drafting, manufacturing, and visualization systems (individually and collectively, "CAD systems"). CAD systems often use databases of geometric models, both two-dimensional (2D) and three-dimensional (3D).

In recent years, object data representing 3D objects, not only conventional CAD data but also 3D object data about commodities have been widely used. In addition, the digitization of objects into 3D object data to establish digital archives has been popularized. The amount of these types of data has steadily increased, thus there have been increasing needs for efficient data management and efficient retrieval of data requested by the user. To meet these needs, various techniques have been proposed. Concerning the techniques for retrieving similar objects, many retrieval methods have been proposed which calculate the features of multimedia objects in feature values expressed in numeric values and use multidimensional vectors composed of the feature values.

Furthermore, various products have nowadays been designed using CAD. A system has been proposed which registers the 3D form data and the component parts of the products in a database and retrieves similar products and parts. For example, in US 2002/0004710 A1, the disclosure of which is hereby by incorporated in its entirety, a system has been proposed which retrieves an object partially coinciding with a 3D form model composed of polygons. In this system, a form-analyzing tree is constructed using an adjacent node as a parent node, with a node including polygon as a reference, and the consistency of a node in the form-analyzing tree is evaluated, thereby determining the similarity of the 3D form. With this approach, for example, a search can be made using a mechanical part made by CAD as a retrieval key and then an object including a part obtained by additionally processing the machine part as a sub-element can be obtained as a similar result. In light of the systems disclosed in the prior art, it is submitted that the present invention now provides for a novel system and methods of comparing two or more 3D object models.

SUMMARY OF THE INVENTION

The present disclosure provides for matching of the 3D object to the reference polygon as a degree of matching between no match and an identical match. For clarity, the method for matching based on total perimeter values is just one technique based on Conditions for Congruence of Triangles, as discussed below.

In one aspect, the present disclosure provides for a novel system and methods of comparing two or more three-dimensional (3D) object model by evaluating at least one reference polygon (triangle) from each received polygonal mesh data. For each reference polygon (triangle) the method includes identifying adjacent polygons (triangles) using conditions for congruence of triangles and performing neighbor facet edge hashing to produce an object hash value for each of the at least one polygon (triangle). The method includes comparing the object hash value to one or more reference hash values assigned respectively to one or more 3D object models. The method includes determining whether a match exists between one or more 3D object models and the reference object based upon an amount of matching of obtained hash values. In one or more embodiments, the method compares 3D polygon (triangle) data of objects, such as a prior scan of the same object, to determine deviations over time or the subtraction or addition of sub-parts.

As a method of calculating the goodness of fit between the reference polygon and the object polygon pattern, there can be considered a method of calculating the goodness of fit from, for example, the degree of matching between the polygon patterns. When the polygons are triangles, the degree of matching between the polygon patterns can be calculated from the degree of matching between the shapes of both the triangles and the degree of matching between the positions of both the triangles, and the like. The degree of matching between the shapes of triangles can be calculated from the degree of matching of one condition for congruence of triangles, and, as the conditions for congruence of triangles, there are "the three pairs of sides of the triangles are equal in length", "two pairs of sides of the triangles are equal in length and the angles formed by the two pairs of sides are equal in measurement", and "one pair of sides of the triangles are equal in length and the two pairs of angles at both the ends of the sides are equal in measurement."

In one aspect, the present disclosure provides for a novel system and methods of comparing two or more three-dimensional (3D) object models. In one embodiment, the present innovation provides a method comprising: (i) receiving polygon mesh data describing a 3D object; (ii) obtaining a perimeter length value (or side length and angle values) for a reference polygon; (iii) comparing the obtained values to stored values for a reference object; and (iv) determining whether a match exists between the 3D object and the stored reference object based upon an amount of matching of the obtained and stored values.

In another aspect, the present disclosure provides for a novel system and methods of comparing two or more three-dimensional (3D) object models. In one embodiment, the present innovation provides a method comprising:

In another aspect, the present innovation provides a method comprises: (i) receiving triangular mesh data describing a 3D object; (ii) in each of one or more separate orientations, obtaining dimensional layers of the 3D object from a slicer program; (iii) obtaining a scalar value from the 2D data of each layer of each of the orientations; (iv) comparing the obtained perimeter length values to stored perimeter length value for a reference object; and (v) determining whether a match exists between the 3D object and the reference object based upon an amount of matching of the obtained and stored scalar values.

In another aspect, the present disclosure provides a method comprises: receiving triangular mesh data describing a three-dimensional (3D) object. The method includes, for each 3D triangle of the received triangular mesh data of the 3D object evaluated as a reference triangle: (i) identifying one or more adjacent triangles that share a side with the reference triangle; (ii) calculating a scalar value from the numerical geometric description of the adjacent triangles; and (iii) assigning the reference triangle the scalar value. The method includes comparing the total scalar values assigned to the 3D object to total scalar values assigned to the reference object; and determining whether a match exists between the 3D object and the reference object based upon an amount of matching of the obtained and stored total perimeter values.

In another aspect, the present disclosure provides a method comprises: receiving triangular mesh data describing a three-dimensional (3D) object. The method includes, for each 3D triangle of the received triangular mesh data of the 3D object evaluated as a reference triangle: (i) identifying one or more adjacent triangles that share a side with the reference triangle; (ii) calculating a value for the length of the perimeters of the adjacent triangles (total perimeter or the equivalent identifying value based on conditions for congruence of triangles); and (iii) assigning the reference triangle the calculated value. The method includes comparing the calculated values assigned to the 3D object to calculated values assigned to the reference object; and determining whether a match exists between the 3D object and the reference object based upon an amount of matching of the obtained and stored calculated values. The calculated values for the between the 3D object and the reference object do not have to correlate 1:1 as two items can be subjected to scaling (size normalizing process), as pre-processing and the matching may be achieved by normalization, standardization, etc. The 3D object can be scaled in one, two or three orthogonal dimensions to match the reference object.

In another aspect, the present disclosure provides a method comprises: receiving triangular mesh data describing a three-dimensional (3D) object. The method includes, for each 3D triangle of the received triangular mesh data of the 3D object evaluated as a reference triangle: (i) identifying three adjacent triangles that share a side with the reference triangle; (ii) calculating a total perimeter value for the length of the perimeters of the three adjacent triangles; and (iii) assigning the reference triangle the total perimeter value. The method includes comparing the total perimeter values assigned to the 3D object to total perimeter values assigned to the reference object; and determining whether a match exists between the 3D object and the reference object based upon an amount of matching of the obtained and stored total perimeter values.

These and other features are explained more fully in the embodiments illustrated below. It should be understood that in general the features of one embodiment also may be used in combination with features of another embodiment and that the embodiments are not intended to limit the scope of the invention.

BRIEF DESCRIPTION OF THE DRAWINGS

The various exemplary embodiments of the present invention, which will become more apparent as the description proceeds, are described in the following detailed description in conjunction with the accompanying drawings, in which.

DETAILED DESCRIPTION

Figure 1:
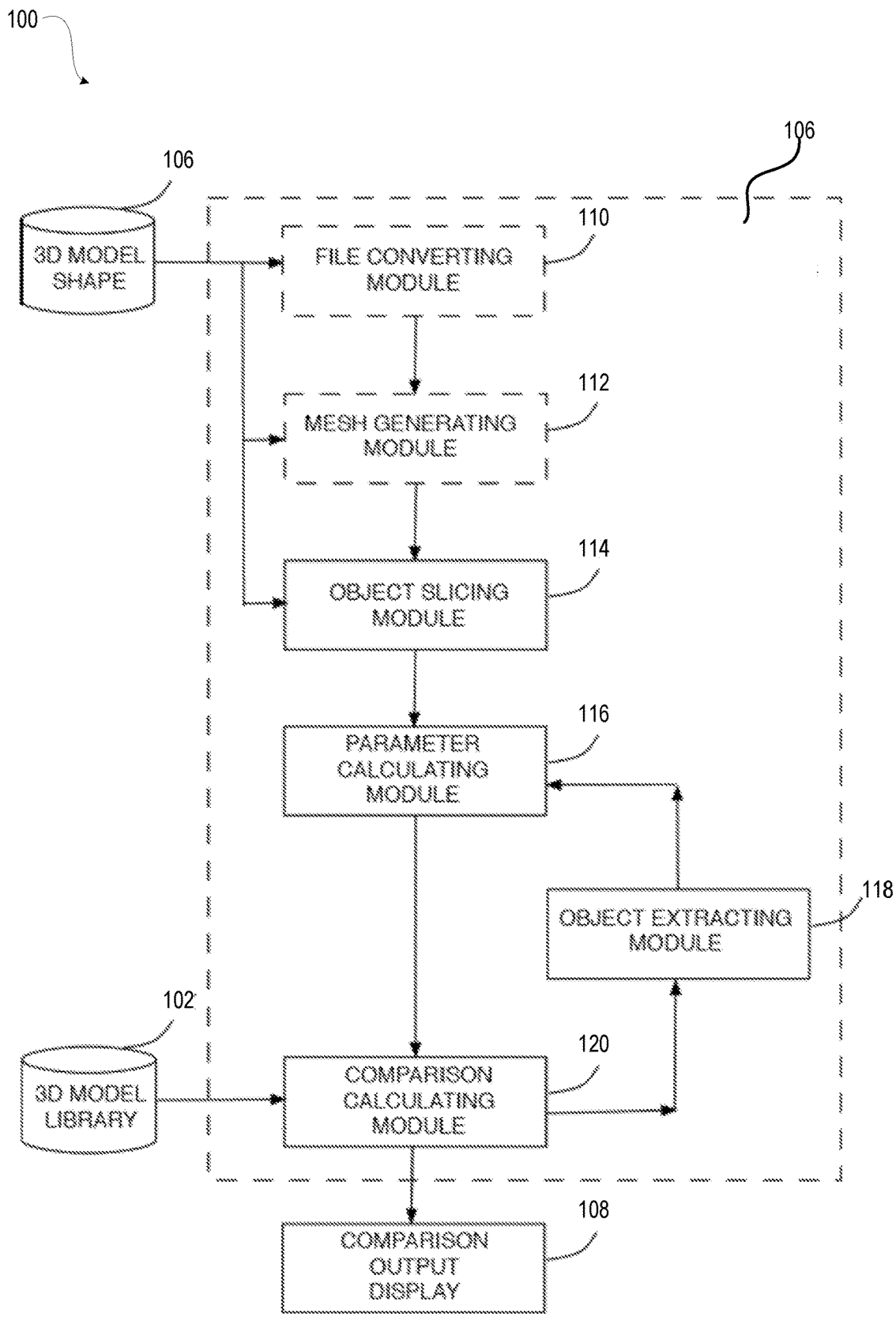
FIG. 1 is a block diagram of an apparatus that matches three-dimensional (3D) objects to a reference object, according to one or more embodiments.

The present invention may be modified in various ways and may be implemented to have several embodiments. Specific embodiments are illustrated in the drawings and are described in detail. It is however to be understood that the present invention is not intended to be limited to the specific embodiments and the present invention includes all modifications, equivalents, and substitutions which fall within the spirit and technical scope of the present invention.

Terms, such as the first and the second, may be used to describe various elements, but the elements should not be restricted by the terms. The terms are used to only distinguish one element from the other element. For example, a first element may be named a second element without departing from the scope of the present invention. Likewise, a second element may be named a first element. The term "and/or" includes a combination of a plurality of related and illustrated items or any one of a plurality of related and described items.

When it is said that one element is "connected" or "coupled" to the other element, it should be understood that one element may be directly connected or coupled" to the other element, but a third element may exist between the two elements. In contrast, when it is described that one element is "directly connected" or "directly coupled" to the other element, it should be understood that a third element does not exist between the two elements.

The terms used in this application are used to only describe specific embodiments and are not intended to restrict the present invention. An expression of the singular number includes an expression of the plural number unless clearly defined otherwise in the context. In this application, terms, such as "comprise" or "have", are intended to designate that characteristics, numbers, steps, operations, elements, or parts which are described in the specification, or a combination of them exist, and should not be understood that they exclude the existence or possible addition of one or more other characteristics, numbers, steps, operations, elements, parts, or combinations of them in advance.

All terms used herein, unless otherwise defined, have the same meanings as those typically understood by those having ordinary skill in the art. The terms, such as ones defined in common dictionaries, should be interpreted to have the same meanings as terms in the context of pertinent technology, and should not be interpreted to have ideal or excessively formal meanings unless clearly defined in the specification.

Hereinafter, preferred embodiments of the present invention are described in more detail with reference to the accompanying drawings. In describing the present invention, in order to help general understanding, the same reference numerals are used to denote the same elements throughout the drawings, and a redundant description of the same elements is omitted.

According to aspects of the present disclosure, a method is provided for comparing two or more three-dimensional (3D) object models. The 3D model may include a polygon mesh. In some embodiments, the polygon mesh is a triangle mesh and the reference polygon is a reference triangle.

In one or more embodiments, the systems and methods of the present invention provide for obtaining triangular mesh data of a 3D object (e.g., from a slicer program). In one or more embodiments, the scalar value computed from the data of each layer of each of the orientations are obtained and compared to stored scalar values for a reference object to determine a degree of matching. In one or more embodiments, measurement data is facilitated by processing software. In another embodiment, smaller objects within the 3D object are also analyzed. In another embodiment, for a more robust approach, each triangle in the triangular mesh data is analyzed by numerically combining the scalar values computed from of surrounding triangles to assign a value. In another embodiment, matching with the reference object is made based on the assigned combined scalar values. In one or more embodiments, the 3D object can be scaled in one, two or three orthogonal dimensions to match the reference object.

In one or more embodiments, the method includes receiving triangular mesh data describing two or more 3D object models. The method includes assigning one of the two or more 3D object models as a reference object. The method includes evaluating at least one 3D triangle from each received triangular mesh data of the two or more 3D object models as a reference triangle, and for each reference triangle: (i) identifying one or more adjacent triangles using conditions for congruence of triangles; and (ii) performing neighbor facet edge hashing to produce an object hash value for each of the at least one 3D triangle. The method includes comparing the object hash value to one or more reference hash values assigned respectively to one or more 3D object models. The method includes determining whether a match exists between one or more 3D object models and the reference object based upon an amount of matching of obtained hash values.

According to other aspects of the present disclosure, a method is provided for identifying deviations in an object. In one or more embodiments, the method includes receiving first triangular mesh data describing an object at a first time. The method includes evaluating at least one 3D triangle from the received triangular mesh data by (i) identifying one or more adjacent triangles using conditions for congruence of triangles; and (ii) performing neighbor facet edge hashing to produce an object hash value for each of the at least one 3D triangle. The method includes creating a first 3D reference model comprises the respective object hash values for the at least one triangle of the first triangular mesh data. The method includes receiving second triangular mesh data describing one of a similar object or the object at a second time that is subsequent to the first time. The method includes evaluating at least one 3D triangle from each received second triangular mesh data for each reference triangle: (i) identifying one or more adjacent triangles using conditions for congruence of triangles. The method includes performing neighbor facet edge hashing to produce an object hash value for each of the at least one 3D triangle. The method includes creating a second 3D reference model comprises the respective object hash values for the at least one triangle. The method includes comparing the first and the second 3D object models.

In one aspect, the present innovation relates generally to a novel system and methods of comparing two or more three-dimensional (3D) object models. The present innovation relates to a three-dimensional data processing apparatus, a three-dimensional data processing method and a three-dimensional data processing program. More particularly, the present invention relates to an apparatus, a method or a program that has capabilities to search for a part similar to a predetermined shape from inputted shape models (such as CAD models or mesh models) and is able to change the search scope in terms of size and/or topology.

In one or more embodiments, a method, in each of three orthogonal orientations, obtains dimensional layers of triangular mesh data of the 3D object from a slicer program. In another embodiment, the method obtains pre-existing 3D modeling triangular mesh data of a 3D object. In another embodiment, perimeter length value for each layer of each of the three orthogonal orientations are obtained and compared to stored perimeter length value for a reference object to determine a degree of matching. In one or more embodiments, measurement data may be facilitated by processing software including but not limited to CNC/3D print software. Smaller objects within the 3D object are also analyzed. For a more robust approach, each triangle in the triangular mesh data is analyzed by totaling the perimeter of surrounding triangles to assign a value. In another embodiment, matching with the reference object is made based on the assigned total perimeter values. In another embodiment, the calculated values for the 3D object and the reference object do not have to correlate 1:1 but can be proportional. The two items can be differently scaled and the matching may be achieved by normalization, standardization, etc. The 3D object can be scaled in one, two or three orthogonal dimensions to match the reference object.

In one or more embodiments, the various methods are utilized according to the average processing time needed for calculations. In another embodiment, the method and process steps are not co-dependent and can be used in a variety of combinations to evaluate similarities and differences between two or more three-dimensional (3D) object models. The analysis methods may be used independently, together with another one or more other analyses, in any given order, and may include other processes for further data collection on a case-by-case basis.

The present innovation relates to a similar shape comparison and retrieval apparatus 100 that comprises: (i) a reference shape model inputting unit 102 for providing a reference shape model; (ii) a test shape model inputting unit 104 for providing a test shape model; (iii) a comparison and retrieving unit 106 for searching for a shape model similar to the test shape model; and (iv) a display unit 108 for displaying any one of the test shape model that is determined as being similar to the reference shape model.

The comparison and retrieving unit desirably comprises: (i) a file converting module (optional) 110; (ii) a mesh generating module (optional) 112 for meshing the shape model to obtain a shape mesh model; (iii) a parameter calculating module 116 for calculating the parameters of the partial shape model; (iv) an object extracting module 118 for dividing the shape model into one or more partial shape models; (v) a comparison calculating module 120 for comparing the amount of similarity of parameter characteristics of the shape model with the parameter characteristics of the reference shape model.

In another embodiment, the comparison and retrieving unit desirably comprises: (i) a file converting module (optional) 110; (ii) a mesh generating module (optional) 112 for meshing the shape model to obtain a shape mesh model; (iii) an object slicing module (optional) 114 for slicing the shape model to obtain slice parameters of the shape model; (iv) a parameter calculating module 116 for calculating the parameters of the partial shape model; (v) an object extracting module 118 for dividing the shape model into one or more partial shape models; (vi) a comparison calculating module 120 for comparing the amount of similarity of parameter characteristics of the shape model with the parameter characteristics of the reference shape model.

The design of the innovation can take on any number of configurations, depending on the intended use of the system. Various configurations may comprise one or more of the following components: (a) a file converting module (optional); (b) a mesh generating module (optional); (c) an object slicing module (optional); (d) a parameter calculating module; (e) an object extracting module; (e) a comparison calculating module (optional); and (f) a comparison output display (optional).

Shape model data is converted into triangular mesh data, and a triangular mesh data group is extracted and classified. The shape model data is divided into "components" having certain characteristics. These are a triangular mesh data converting processing and a partial characteristic shape extracting processing. The characteristic amount of the triangular mesh data group representing the classified partial characteristic shape is calculated, and then the difference between the calculated characteristic amount of the triangular mesh data group and the characteristic amount of the reference shape is calculated. A list of candidates for similar shapes is displayed based on the difference value of the characteristic parameter amounts.

Figure 2:
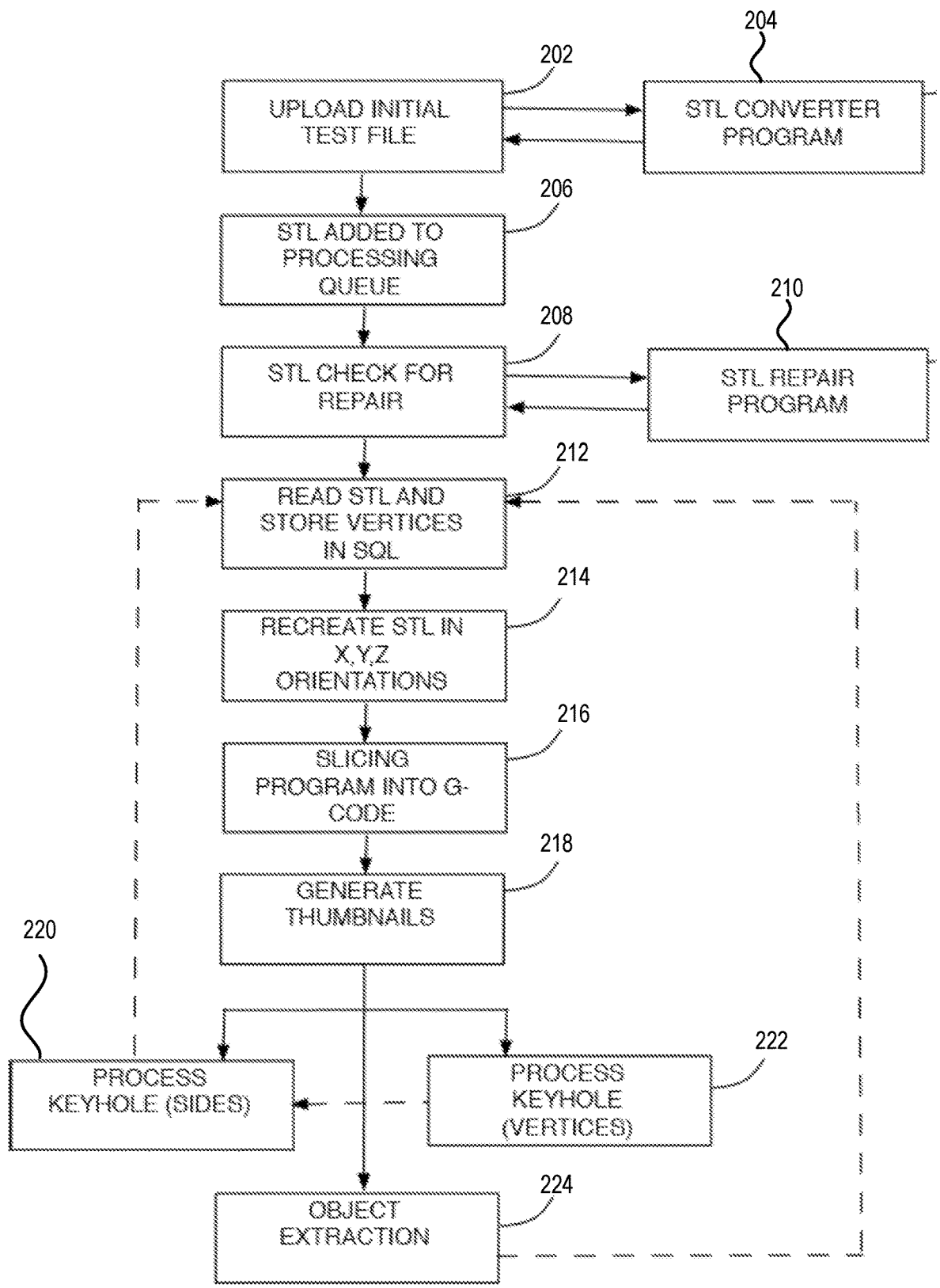
FIG. 2 is a flow diagram of a method of matching 3D objects to a reference object, according to one or more embodiments.

FIG. 2 illustrates a method 200 including preliminary steps to get ready for processing:
 (1) Commercially available computer aided design software such as SolidWorks (Dassault Systemes SolidWorks Corp., Waltham, Mass.) or AutoCAD (Autodesk, Inc., San Rafael, Calif.) is used to produce a digital 3D model computer data file or an already existing digital 3D model computer data is obtained;
 (2) In block 202, upload model to database. Various types of files that may be uploaded to a server for visualization may include, but are not limited to, 3dxml, 3mf, asab, asat, asm, catpart, catproduct, dwg, dxf, fbx, glb, gltf, iges, igs, ipt, jt, model, obj, par, prt, sab, sat, sldasm, step, stl, stp, usd, usdz, vda, x_b, x_t, and xcgm files.
 (3) In block 204, convert the file to the same format. One nonlimiting example of a format is .stl. In an exemplary embodiment, the files are all converted to STL although other formats can be used. Can convert using commercial software such as NuGraf and PolyTrans Pro Translation System by Okino Computer Graphics in Ontario Canada. The system may take any existing 3D model such as from a scan like a CT scan, CAD file, etc. and convert the scan into an STL file.
 (4) In block 206, upload data (e.g., .stl) file to processing queue with all dimensional units being the same (e.g., all metric or all English).
 (5) In block 208, check if repairs are needed. If repair needed, send uploaded file to a repair module (block 210) such as a generally known slicer program.

STL (STereoLithography) is a file format native to the stereolithography CAD software created by 3D Systems. STL has several after-the-fact backronyms such as "Standard Triangle Language" and "Standard Tessellation Language". This file format is supported by many other software packages; it is widely used for rapid prototyping, 3D printing and computer-aided manufacturing. As used herein, the term STL or .stl file refers to computer data file that may be uploaded to a server for visualization of a 3D object, which may include, but is not limited to, 3dxml, 3mf, asab, asat, asm, catpart, catproduct, dwg, dxf, fbx, glb, gltf, iges, igs, ipt, jt, model, obj, par, prt, sab, sat, sldasm, step, stl, stp, usd, usdz, vda, x_b, x_t, and xcgm files.

In an exemplary embodiment at a first stage, the method 200 for processing the uploaded file includes a first step of reading the object data file and storing vertices in an SQL data (block 212). Vertices are where each point of a triangle is in three-dimensional space. Thus, data is stored as three-dimensional reference points of the three points of triangle. Calculations are made as to the lengths of sides (and/or angles) from the three points. Reference data and measurements are associated with an assigned identifier for the triangle based on the order processed. Objects that are scanned can have 500,000 or more triangles. The data (e.g., .stl) file provides surface triangles and solid pyramids. Surface definition of an object is obtained by a file converting module that: (a) accesses the polygon mesh data file; (b)

orients object into three orthogonal axes {x, y, z}; (c) orients and/or rotates the mesh data to obtain one more orientations for presentation. The orientations provide the combinations as needed regardless of what orientation an object originates in. The three orientations provide every combination regardless of what orientation an object originates in. In general, the object data providing software makes plane "1" the face, which is oriented for the slicer. The other two orientations achieve orthogonal set of slices or other data sets.

In an optional second stage in block 214, the method includes recreating data (e.g., .stl) file from SQL version in three orthogonal axes {x, y, z} by rotating 90° degrees left and 90° back. In a third stage, the matter includes slicing each of the three orientations with MATTERSLICE to obtain three sets of G-Code. Slicing programs (e.g., slic3r, MatterSlice, craftware, matter control, etc.) can yield an answer that is then taken apart as the perimeter numbers by generating a G-Code. G-Code is a machine language for a computer numerical control (CNC) or three-dimensional printers from which objects can be made. Using the G-code, the method includes measuring the perimeter of all of the slices. As an example, consider that the G-Code provides 400 slices, which would yield 400 perimeters to compare. Look for a match of those 400 perimeters in any order. Slice 1 does not have to match with slice 1 due to different orientations. Get a score based on the number of layers. For example, the match can be 0 for no matching slices to 400 in this example for a perfect match.

In one or more embodiments, the method includes an optional step wherein 3D form data is brought into the posture that maximizes the longest coordinate. It may be possible to use a method of setting such a coordinate system as maximizes the x, y, and z coordinates, calculating the similarity in each case, and outputting the case with the highest similarity as the result of the retrieval.

In one or more embodiments, one or more data acquisition devices can be used to generate raw 3D data about an object and to input the raw 3D data to the server. Some examples of suitable data acquisition devices include laser scanners for acquiring 3D surface data and MM scanners, CAT scanners or Laser Confocal Microscopes for acquiring 3D volume data It will be understood, however, that the data acquisition devices can include any device that generates digitized 3D data from an object. The 3D acquired data can be 3D surface data, such as that generated by optically scanning the surface of an object, or it can be 3D volume data that includes information about the interior of an object, such as that obtained from MM scans, CAT scans or Laser Confocal Microscope volume data.

In an example of 3D surface data, when an object is scanned using a laser scanner, several tens or hundreds of thousands point coordinates are generated, each representing a location on the object. This collection of points is referred to as a 'point cloud.' It has no structure and is simply a file containing point coordinate data as x, y, z values. Point cloud information also can be generated using computer programs, either interactively or automatically from mathematical functions, as is well-known in the art. In either case, to work with this point cloud, it has to be structured or modeled.

One advantageous method to model 3D data is to triangulate the point cloud to generate a mesh of triangles having the digitized points as vertices. 3-D triangular meshes are a known surface modeling primitive used to represent real world and synthetic surfaces in computer graphics. Each triangle 'knows' about its neighbors, which is the structure that allows fast processing of the geometry represented by the triangulation. It is important to stress that the same set of vertices or data points could have several triangulations. The emphasis, therefore, is on the vertices themselves, rather than the 'surface' as represented by the triangles. A triangle mesh representation consists of information about geometry and connectivity, also known as topology. Geometry defines the location of vertices in a (Euclidean) coordinate system. They are represented as triplets (x, y, z). Connectivity defines the sets of points that are connected to form triangles or faces of the mesh. Triangles are given by three index values, which identify the three vertices bounding the triangle.

In one or more embodiments, one or more data compression modules can be used to compress certain data for enhanced storage and transmission.

In an earlier prototype, Slic3r product, which is open source, was used. MatterSlice open-source product is used in a later version in order to better handle lower resolution cases. Slicer parameters are set as follows:

In block 216, set Slicer Parameters: (1) Unit measurement for layer (0.1); (2) Remove any solids in between perimeters and do not fill in any solids or infill, thus providing only a shell of everything with dimension of 1 unit; and (3) provide a material size that is being input to fill the shell. The layer perimeter is automatically calculated, which includes an external layer and may include an internal layer as well for holes or objects within the model. The data for each layer is compared to the layers of data within our database. Matches are ranked based on a percentage of the match to models in our database including a match against perimeters within a given model.

Figure 3C:
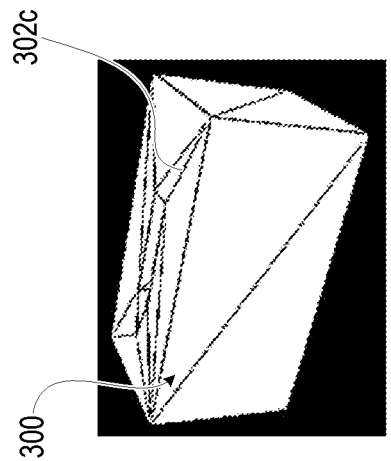
FIGS. 3A-3C are isometric orthogonal views of an example 3D object having a keyhole, according to one or more embodiments.
Figure 3B:
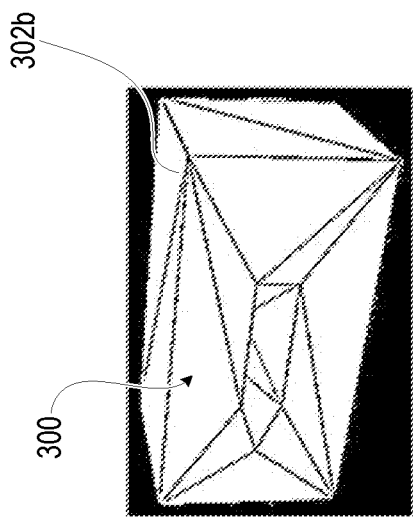
Figure 3A:
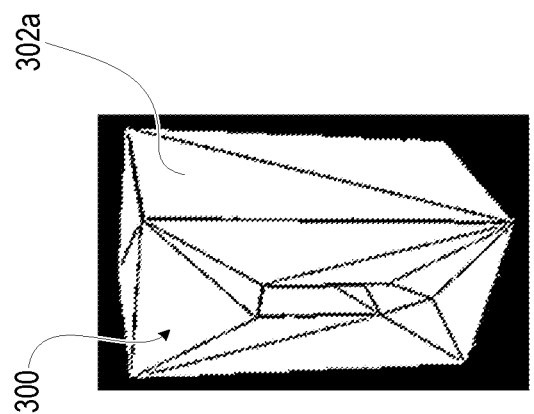

Layers are addressed in stage 3: Three evaluations performed with object in three different orientations. Consider a model 100 in orientations 102a-102c illustrated respectively in FIGS. 3A-3C. Note that a 180° turn from one of these orientations will produce the same result. Therefore, it is not necessary to turn the model 300 to all possible orientations. Orientations 300a-300c allow for analysis of the model 300 using layering in all possible 90° variations from the initial orientation of the model 300.

In one example, the Layers are calculated as 0.1 mm in height. The outside perimeter of each layer is calculated. Each layer is assigned a value corresponding to its perimeter. The layers can be in 1, 0.5, 0.1 units. In one example, the program is "assuming" everything is in metric so assumes metric and does 0.1 mm regardless of whatever units the STL file is actually measured in. Also note that when a search is being performed, the nearest matches will show up in order. Objects are identified within other objects here in Step 1 and their perimeters are calculated for matching prior to Step two (extraction).

In Stage 4 in block 216, the G-code processed to strip away unnecessary information to speed processing by only retaining a length of every layer. In Stage 5 in block 218, thumbnail images are generated for users to be able to easily and quickly view a model, object or part that has been scanned and processed. In one embodiment, POV-Ray software is used based on a first image presented such as a front face camera view. "POV-Ray" or "Persistence of Vision Raytracer" is by Vision Raytracer Pty. Ltd., Williamstown, Victoria, Australia.

Figure 4:
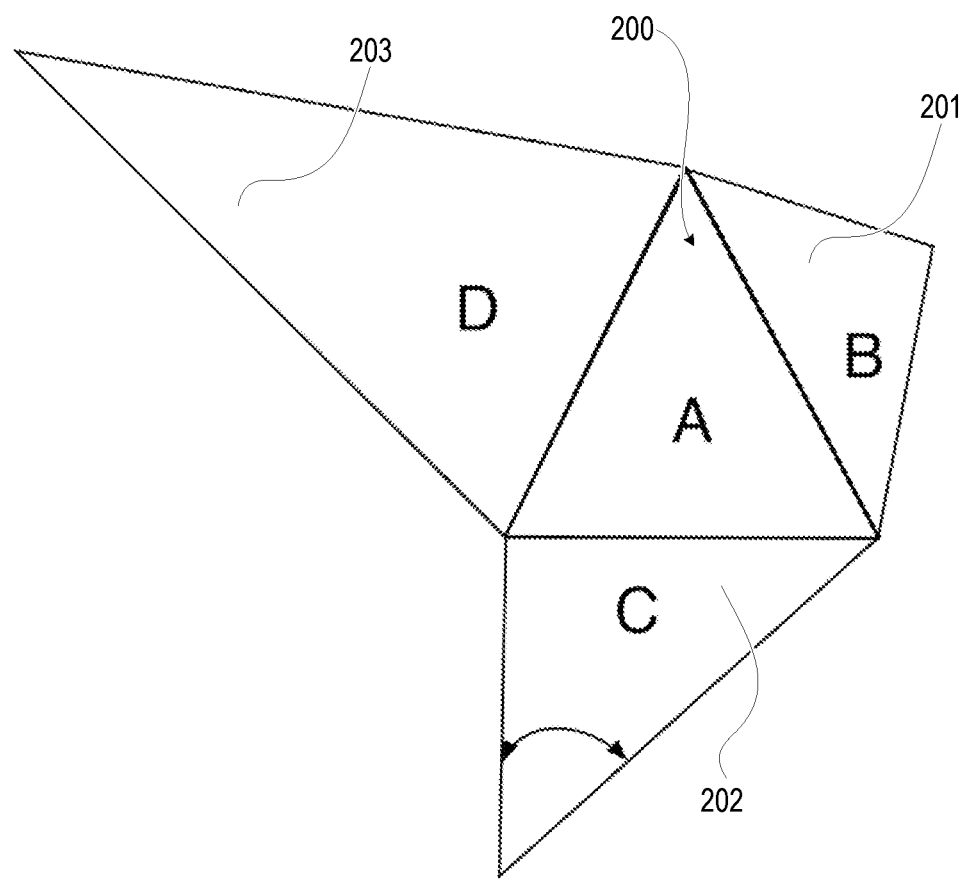
FIG. 4 is a diagram of reference triangle surrounded by three adjacent triangles, according to one or more embodiments.

Stage 6 consists of two steps, blocks 220, 222, of which either or both can be performed. Selection can be made based on processing demand considerations. In Step 1 of Stage 6, SQL vertices are processed for four triangle set keyhole. FIG. 4 illustrates a first triangle A 200 surrounded by a sharing a respective side by triangle B 201, triangle C 202, and triangle D 203. Calculate all three parameters for all 4 triangles=three-dimensional reference points of three points of triangle+calculate lengths of sides from three points+the order of how read (triangles assigned numbers in order, 500,000+ triangles; here just putting the information together; was already calculated above; now putting the 4 together and assigning a number.

To restate, in step 1, sides relate to a 4-triangle keyhole. Look at the three pieces of data (reference points+calculated sides of all 4 triangles). That is, look at a reference triangle A plus the three triangles B, C, & D that touch the three SIDES of the reference triangle A. Each triangle of the object is individually calculated as triangle #1 of a 4-triangle set keyhole. Thus, if there are 1000 triangles, there are 1000 triangle #1's of a 4-triangle set keyhole. Four pieces of data are considered in one or more embodiments: (a) Look at sides of triangle A, B, C, D; and (b) determine the order for assignment and data sequence of surrounding triangles B, C, D according to an adopted convention. In one embodiment, a first column of data contains perimeter only. Second, third and fourth columns can contain a length of the respective shared side of the triangle A.

In measuring the lengths of the one or more triangles sharing a side with the reference triangle, the measurements take place using the default/initial orientation of the model and going south (downwards) from the reference triangle. In one example, the triangle "under" the reference triangle, i.e. the triangle below the reference triangle sharing the reference triangle's bottom line, is therefore the first point of measurement. The perimeter is measured and results in a number for that triangle. In one example, one or more additional triangles are measured. In the above example, triangle "5" is located under the reference triangle ("1"). The perimeter of "5" is measured, followed by the perimeter of "4" and then that of "3". In one specific example, this results in the perimeter lengths of 85 mm for "5", 300 mm for "4" and 65 mm for "3".

Notes that the data retrieved result in a numerical value for the reference triangle, which is based on the one or more adjacent triangles' perimeters. Every triangle within a model is processed as a reference triangle in this manner. This results in overlapping data. The entire model is processed as if it were flat. The topographical relationships between triangles are irrelevant to this process. Although it is counter-intuitive, Step 3 results in superior calculations in terms of both speed and accuracy (including reliability) compared to technology using more straight-forward and readily apparent approaches.

Figure 5:
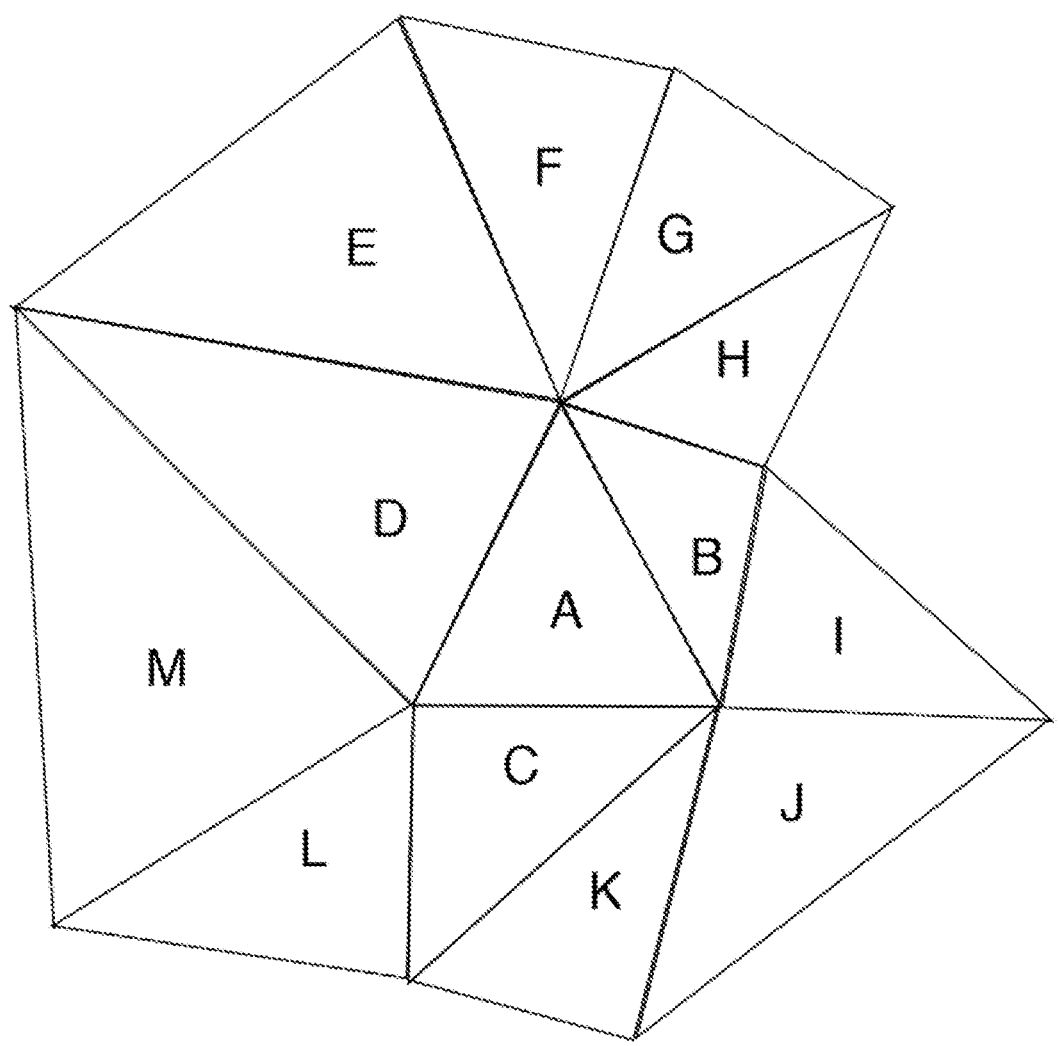
FIG. 5 is a diagram of a reference triangle surrounded by three adjacent triangles and other triangles that share a vertex, according to one or more embodiments.

Returning to FIG. 2 in Step 2 of Stage 6 in block 222, eight (8) vertices that touch Triangle A by triangles B-D are evaluated as illustrated in FIG. 5. In addition, triangles E-K share at least one vertex with Triangle A and are also considered. Each triangle of the object is individually calculated as triangle #1 of an 8+ triangle set keyhole. So, if there are 1000 triangles, there are 1000 triangle #1's of an 8+ triangle set keyhole. With more triangles to consider, Step 2 can be significantly more processor intensive than Step 1. Note that these data points are registered in the same fashion as in Step 1. However, in Step 2, additional calculation takes place. For pieces of data for starting triangle A: (1) Get perimeter of triangle A; (2) Get side lengths of three sides of triangle A; (3) Looking at sides of triangle A, determine which triangles are B-D that share a side; (4) Get perimeter of triangles B-D; (5) triangles B-D; (6) determine what triangles E-K are touching the three points or vertices of triangle A other than triangles B-D; (7) Get perimeter of touching triangles E-K; and (8) Get side lengths of touching triangles E-K. Perimeter of triangle A+what 3 sides measurements are =4 total data points then which triangles touch triangle A.

Returning to FIG. 2 in Stage 7 in block 224, object extraction is performed. If the reference model is inside other models in the database, the reference model will be extracted in this step and analyzed. The same is true for other models inside the database that exist within the reference model. An object is derived from the model, i.e. a sub-model is isolated and analyzed independently of the parent model. The object could be a hole or void or other part.

In an illustrative example, stage 7 object extraction can detect a short bolt as being a reference object that is found to be part of a longer but otherwise identical bolt. Conversely, a longer bolt can be the reference object. A shorter, but otherwise identical bolt, would be identified as comprising the corresponding percentage of the longer bolt. It would therefore show up as a perfect match for that section of the bolt.

In a similar example, object extraction can be performed with a particular bolt as the reference object database with the scanned model database being a jet engine. The .stl file can be an assembly file. In particular, a "jt" file is an open format that allows a substantial number of notes to be inserted in the file. Identical bolts can be extracted from within the jet engine and shown to match. The location of each match within the engine can be identified and highlighted. There is no practical limit to the number of such subassemblies or parts that can be detected, such finding 600 bolts within an engine and distinguishing them from 400 screws. Uses of such information can include building a bill of materials for a particular object, detecting counterfeit patented parts, diagnosing a failure mode of components. etc.

Each of the stages and steps described above can be performed individually or various combinations. For example, Stage 1 can be performed followed directly by Stage 6. For another example, if there are more than one mesh/object being analyzed, within a model database, every mesh/object can be analyzed individually through each of the stages.

The present invention is a basic technology for providing great usability when handling three-dimensional data and covers a broad range of applications. The searching step is desirably capable of changing the mode of recognition of similarity between the query shape model and the characteristic part in terms of size or topology.

In one or more embodiments of the present invention, it is possible to flexibly retrieve and display a shape part that is similar to arbitrary query shape data in terms of size or topology. One of the fundamental questions to ask is when two shapes are really the same. This does not have a unique answer, it depends on the aspects of the shape that you are most interested in. At a basic level, if two shapes are identical, but are situated in different places, then for most purposes we will count them as being "the same". Topology has a much broader notion of sameness than geometry. Here, two shapes are deemed "the same" if one can be pulled, stretched and twisted into the form of the other.

Topologically similar shapes can be retrieved by lowering a threshold of similarity. Lowering the similarity threshold, e.g., expanding the region of the target shape, allows the range of the shape being retrieved to be expanded. The present invention uses mesh information to perform similarity search. Therefore, the present invention allows shapes to be found that are similar although different in the topological construction.

In one or more embodiments, another Stage or Step can be performed for scaling the results. If the number of facets within a model or object identified within a model is identical to the reference model, the compared model (or model found within the database in the case of a search) can be scaled accordingly. Following scaling, layer analysis (step 1) can be performed to identify the extent to which a model has been scaled or stretched. If a model is stretched in one direction, e.g. lengthened, the processing in Step 1 following the identification of a matching model in Step 5 will produce the extent to which scaling has taken place (e.g. 50% longer). If a model is stretched in multiple directions, e.g. the model is expanded to be proportionally 500% larger, since the scaling process in Step 5 makes the compared model the same size as the reference model, the layer-based result would result in a 100% match (assuming no further differences existed between the models elsewhere). In this event, the ratio by which the compared model or the model found in the database had to be scaled is presented: e.g. an 87% reduction or expansion in total size.

In an exemplary method: (1) Process 3 is performed; (2) Get number of triangles from the stl file and see if same or within 10%; (3) Take first 1, 2, 3, 4, or so triangles from the file and compare to the first ones from the second file and see a ratio of side length; (4) May do this ratio three times for the three sides to see; (5) process the matches to lots of data points; and (6) Go back to earlier process steps to start processing while applying the ratios to see if every triangle matches.

In one or more embodiments, density calculations can be performed as another source of information for matching objects. In addition, artificial intelligence can be incorporated to extend use cases to predictive and even prescriptive analyses. One or more embodiments may employ various artificial intelligence (AI) based schemes for carrying out various aspects thereof. One or more aspects may be facilitated via an automatic classifier system or process. A classifier is a function that maps an input attribute vector, x=(x1, x2, x3, x4, xn), to a confidence that the input belongs to a class. In other words, f(x)=confidence (class). Such classification may employ a probabilistic or statistical-based analysis (e.g., factoring into the analysis utilities and costs) to forecast or infer an action that a user desires to be automatically performed.

A support vector machine (SVM) is an example of a classifier that may be employed. The SVM operates by finding a hypersurface in the space of possible inputs, which the hypersurface attempts to split the triggering criteria from the non-triggering events. Intuitively, this makes the classification correct for testing data that may be similar, but not necessarily identical to training data. Other directed and undirected model classification approaches (e.g., naïve Bayes, Bayesian networks, decision trees, neural networks, fuzzy logic models, and probabilistic classification models) providing different patterns of independence may be employed. Classification as used herein, may be inclusive of statistical regression utilized to develop models of priority.

One or more embodiments may employ classifiers that are explicitly trained (e.g., via a generic training data) as well as classifiers, which are implicitly trained (e.g., via observing user behavior, receiving extrinsic information). For example, SVMs may be configured via a learning or training phase within a classifier constructor and feature selection module. Thus, a classifier may be used to automatically learn and perform a number of functions, including but not limited to determining according to predetermined criteria.

One application would be a "Doctor ATM" or "ADM (Automatic Doctor Machine)" that uses a CT scanner to look at an entire body, identify individual components such as organs and compare these components to previous scans of known healthy and diseased organs and look for early indicators of diseases and cancers. The comparison can also be made to a previous model made of the same individual to detect a trend. Regular scanning would allow our algorithm to make alerts if a known pattern emerged that is indicative of the early onset of a disease such a degenerative skeletal condition, a type of cancer, or an enlarged heart.

One use of the processed described herein is match a reference object database for fonts to see if letters can be matched from within an object. With letters found, words or engraved model numbers can be identified from within an object. Another use is to confirm that a product has been assembled with the correct fasteners or components or to correctly identify what components should be used in new or repaired assemblies. Can analyze a series of different versions of a product to identify an evolution over time in components used. An unknown physical part can be scanned and matched to an original .stl version of CAD/CAM model in order to make additional replacement units. A matched prototype or portion of a prototype can identify a previously designed, tested, and manufactured component that closely matches, thus avoiding creating an unnecessary second supply chain.

Schools can check for cheating by students who create 3D models for an academic exercise. The present disclosure provides for identifying matches of portions of the model, stretched or rescaled models, etc. Schools can share databases of known previously existing models to make copying more difficult.

Figure 6:
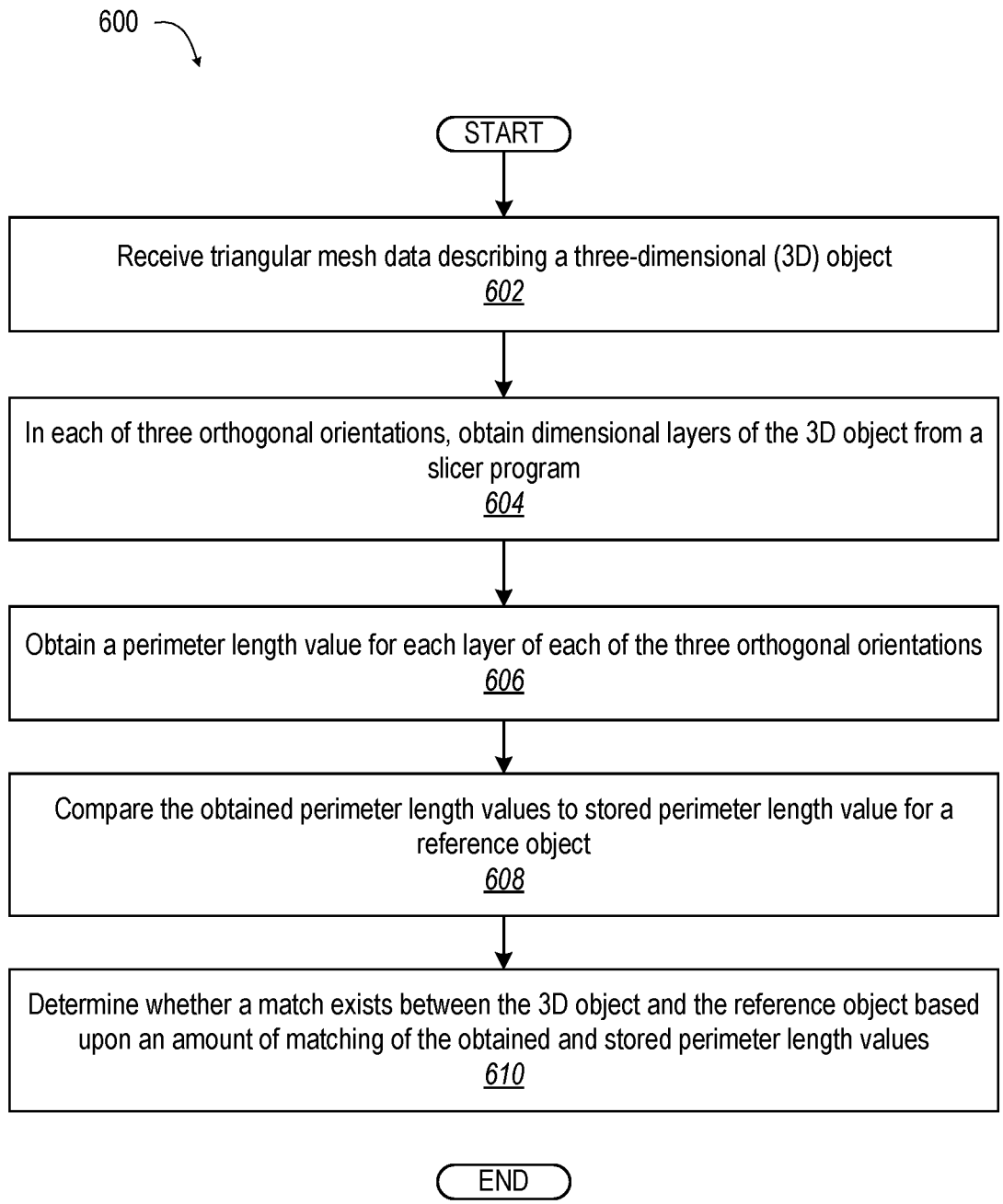
FIG. 6 illustrates a flow diagram of an example method of expedited matching using slice perimeter measurements, according to one or more embodiments.

FIG. 6 illustrates a flow diagram of an example method 600 of expedited matching using slice perimeter measurements, according to one or more embodiments. Method 600 begins receiving triangular mesh data describing a three-dimensional (3D) object (block 602). Method 600 includes, in each of three orthogonal orientations, obtaining dimensional layers of the 3D object from a slicer program (block 604). Method 600 includes obtaining a perimeter length value for each layer of each of the three orthogonal orientations (block 606). Method 600 includes comparing the obtained perimeter length values to stored perimeter length value for a reference object (block 608). Method 600 includes determining whether a match exists between the 3D object and the reference object based upon an amount of matching of the obtained and stored perimeter length values (block 610). Then method 600 ends.

Figure 7:
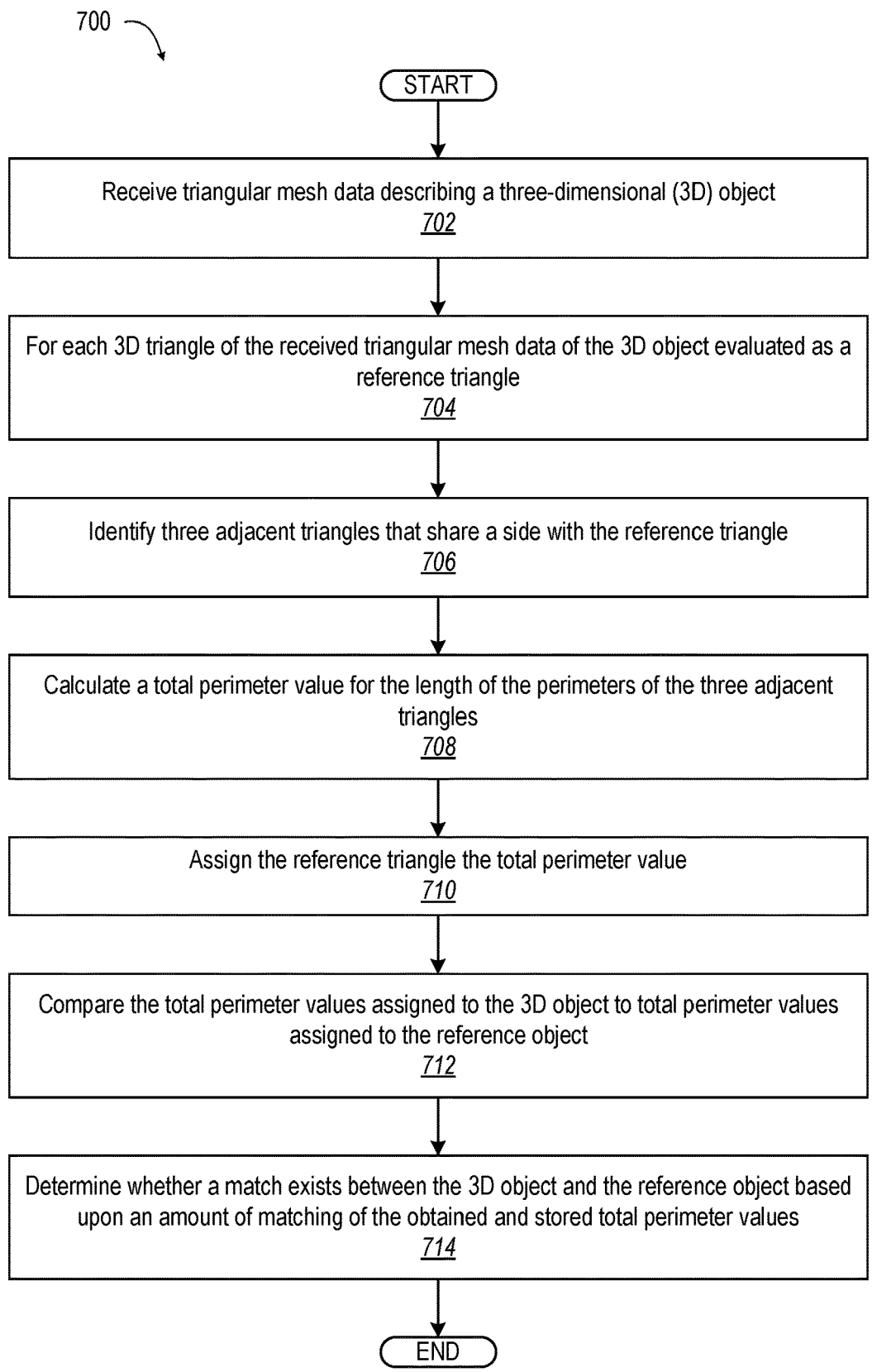
FIG. 7 illustrates a flow diagram of an example method of rigorous matching associating each reference triangle of a 3D triangular mesh with perimeter totals for adjacent triangles, according to one or more embodiments.

FIG. 7 illustrates a flow diagram of an example method 700 of rigorous matching associating each reference triangle of a 3D triangular mesh with perimeter totals for adjacent triangles, according to one or more embodiments. Method 700 begins receiving triangular mesh data describing a three-dimensional (3D) object (block 702). At block 704, for each 3D triangle of the received triangular mesh data of the 3D object evaluated as a reference triangle: Method 700 includes identifying three adjacent triangles that share a side with the reference triangle (block 706). Method 700 includes calculating a total perimeter value for the length of the perimeters of the three adjacent triangles (block 708). Method 700 includes assigning the reference triangle the total perimeter value (block 710). Method 700 includes comparing the total perimeter values assigned to the 3D object to total perimeter values assigned to the reference object (block 712). Method 700 includes determining whether a match exists between the 3D object and the reference object based upon an amount of matching of the obtained and stored total perimeter values (block 714). Then method 700 ends.

It is contemplated that aspects of the present innovation will find application as follows for the three stages of development including product design, production and utilization.

These stages include:
 a. Design Stage
   i. CAD
   ii. 3D Models
 b. Actualization
   i. Production
   ii. Scans of 3D part using laser scan
 c. Utilization
   i. Wear & Tear
   ii. Performance
   iii. Scans of 3D part using laser scan During Design Stage Enhancement/Improvement, examples of uses include: (i) CAD (SolidWorks, SolidEdge, AutoCAD); (ii) ANSI and other standards compliance; (iii) Searching for similar models and similar differences; (iv) Differences between models or versions; (v) Searches for physical attributes and within certain cases—defined tolerances; (vi) Add: quality control to see that a part (scan or 3D drawing) not just same part/item but any changes: (a) +tolerance adherence for example +/−; and (b) For example, add in that the gold standard is x, but has a tolerance is Y.

Actualization Stage Enhancement covers 70% of the potential market. Examples include: (i) Quality Control such as (a) Compare 3D Model (CAD) with a scan; and (b) Compare a Scan of an object that is a Gold Standard with the scan of object in question to test. Examples include: (ii) Auto-Recognition of "2D" info on PDFs and other documents written by engineers to auto-adjust the settings of our 3D model analysis.

Aspects of the present innovation look to improve quality control by improving speed and efficiency, especially as compared to generally-known visual human inspection that is slow and costly and can only do so many inspections.

A coordinate measuring machine (CMM) is a device used in the measurement of the physical geometrical characteristics of an object. These machines can be manually controlled by an operator or they may be computer controlled. Measurements are defined by a probe attached to the third moving axis of this machine. CMM is also a device used in manufacturing and assembly processes to test a part or assembly against the design intent. By precisely recording the X, Y, and Z coordinates of the object, points are generated which can then be analyzed via regression algorithms for the construction of features. These points are collected by using a probe that is positioned manually by an operator or automatically via Direct Computer Control (DCC). DCC CMMs can be programmed to repeatedly measure identical parts; therefore, this can be seen as a specialized form of industrial robot.

Having a robust inspection process to improve quality control is critical in today's world of manufacturing. With accurate 3D scanning and inspection analysis, companies can reduce iterations/tuning loops and quickly derive the proper corrective action without slowing down their time to market goals. In one or more embodiments, 3D scanners measure the geometries of a physical part and brings it into the digital world. The data output is typically a point-cloud represented in STL (stereolithography) file format. This data is used to compare to the original CAD drawings or to a previous scan of gold standard part within tolerances.

Dimensional data may be acquired with a variety of techniques. For the inspection of parts, which may be delicate and may have steep geometries, non-contact techniques are generally used, i.e., no physical probe touches the part. Non-contact techniques all generally detect some form of energy emanating from the sample being probed. Suitable energy forms include light, heat, and sound. When the energy is in the form of light, the light may include one or more of visible light, infrared (IR) light, near-infrared (NIR) light, and ultraviolet (UV) light. Energy detectors suitable for light detection include photodetectors, for example a photodiode, a position sensitive device, an array detector, and a CCD (charge coupled device). Energy detectors suitable for heat detection include infrared imagers. Energy detectors suitable for sound detection include ultrasonic transducers.

The dimensional measuring device may use machine vision, 3D optical scanning, photogrammetry, and/or structured light imaging. Depending on the configuration, the dimensional measuring device may generate 2D (two-dimensional) and/or 3D geometric measurements of the part. Machine vision is a technique that uses electronic imaging and algorithms to extract geometric information from images of the part. 3D optical scanning is a technique which uses light reflection, often from a laser, to calculate the surface geometry of the part. Photogrammetry is a technique that determines the geometry of the part through analysis of electronic images, commonly multiple images from different angles. Structured light imaging is a technique that projects a pattern of light onto the part and calculates the surface profile from detected distortions of the pattern reflected by the surface of the part.

If the dimensional measure device includes and uses an energy emitter, the energy emitter imparts energy onto the part. Generally, for non-contact measurement, the energy is a radiative form, such as light, heat, and/or sound. Whatever the form of energy, the energy emitter does not typically impart enough energy to damage or otherwise interfere with the part. Energy emitters suitable for light emission include lamps, wide-field illuminators, structured illuminators, lasers, laser scanners, flash lamps, and modulated illuminators. Further, dimensional measuring device may be configured to use ambient light as a supplement or alternative to a light energy emitter. Accordingly, an energy detector may be configured to detect ambient light reflected and/or transmitted by the part. Energy emitters suitable for heat emission include heaters. Energy emitters suitable for sound emission include ultrasonic transducers.

In one or more embodiments, 3D Scan (e.g., laser scan) plus helper software (e.g., Polyworks) can be used to measure the physical geometrical characteristics of an object. Aspects of the present innovation include obtaining 3D laser scan and then comparing to either a CAD standard and/or laser scan of a gold standard.

In one or more embodiments, 3D scanning equipment can be usable on large structures such as for inspection of cell towers and military antenna. The 3D scan data can be used for the required twice annual inspections to confirm that alignment of the tower and attached antennae are providing a best field of view/reception. For example, scanning can be performed by an automated drone that scans with a Lidar, laser, computed tomography (CT), and photogrammetry, etc., to get 3D model. Once 3D scan data is obtained, the present innovation can compare relevant aspects of a scanned object to a previously determined gold standard such as a designated CAD drawing or preciously scanned object in terms of relevant parameters such as height, center line, angle, etc. User can put in tolerances as defaults or user set by number or percentage, etc.

In one or more embodiments, a method for modeling a cell site with an Unmanned Aerial Vehicle (UAV) is provided wherein the method comprises causing the UAV to fly a given flight path about a cell tower at the cell site; obtaining a plurality of scans of the cell site about the flight plane; and obtaining and processing the plurality of scans to define a three dimensional (3D) model of the cell site based on the one or more location identifiers and/or one or more objects of interest.

In one or more embodiments, an Unmanned Aerial Vehicle (UAV) comprises one or more rotors disposed to a body; one or more scanning devices associated with the body; wireless interfaces; a processor coupled to the wireless interfaces and the one or more scanning devices; and memory storing instructions that, when executed, cause the processor to: process commands to cause the UAV to fly a given flight path about a cell tower at the cell site; and provide the plurality of scans to a processing system which defines a three dimensional (3D) model of the cell site based on the associated with one or more location identifiers and one or more objects of interest in the plurality of photographs.

In one or more embodiments, a method performed at a cell site with an Unmanned Aerial Vehicle (UAV) communicatively coupled to a controller to perform a cell site audit using 3D scanning, without requiring a tower climb at the cell site, includes causing the UAV to fly substantially vertically up to cell site components using the controller; collecting data associated with the cell site components by scanning the components of the cell site using the UAV; transmitting and/or storing the collected data; and processing the collected data to obtain information for the cell site audit.

In one or more embodiments, the present disclosure relates to three-dimensional (3D) modeling of cell sites and cell towers with unmanned aerial vehicles. The present disclosure includes UAV-based systems and methods for 3D modeling and representing of cell sites and cell towers. The systems and methods include obtaining various three-dimensional scans via a UAV at the cell site, flying around the cell site to obtain various scans of different angles of various locations (i.e., enough scans to produce an acceptable 3D model), and processing the various pictures to develop a 3D model of the cell site and the cell tower. Additionally, once the 3D model is constructed, the 3D model is capable of various measurements including height, angles, thickness, elevation, even Radio Frequency (RF), and the like.

In one or more embodiments, the present disclosure provides for a cell site audit used to determine a down tilt angle of individual antennas of the cell site components. The down tilt angle is the mechanical (external) down tilt of the antennas. In the cell site audit, the down tilt angle is compared against an expected value.

In one or more embodiments, the present disclosure provides for methods for verifying the antenna azimuth, such as verifying the antenna azimuth is oriented within a defined angle. The azimuth (AZ) angle is the compass bearing, relative to true (geographic) north, of a point on the horizon directly beneath an observed object.

The 3D scanning sensor allows the system to capture the 3-dimensional geometry and position of an object. This 3D scanning sensor may use any of the following technique or a combination of the following technique to capture the 3D position and geometric topology. These 3D scanning techniques may be but not limited to visible and non-visible structured light, photogrammetry, laser dynamic range imager, light detection and ranging (Lidar), laser triangulation, stereoscopic and photometric data, polarization of light, or similar and may even make use of a combination of several of the above-mentioned techniques to create a textured or non-textured 3D scan. These 3D scanners may use visible light or invisible light (e.g. infrared) to illuminate and capture the object or person. In addition, the sensor assembly may use a camera and illumination system that emits and is sensible to a certain range of ultraviolet rays. This may allow to capture and detect skin age spots. The sensor assembly also may contain a light emitting device that allows to illuminate an object.

Figure 8:
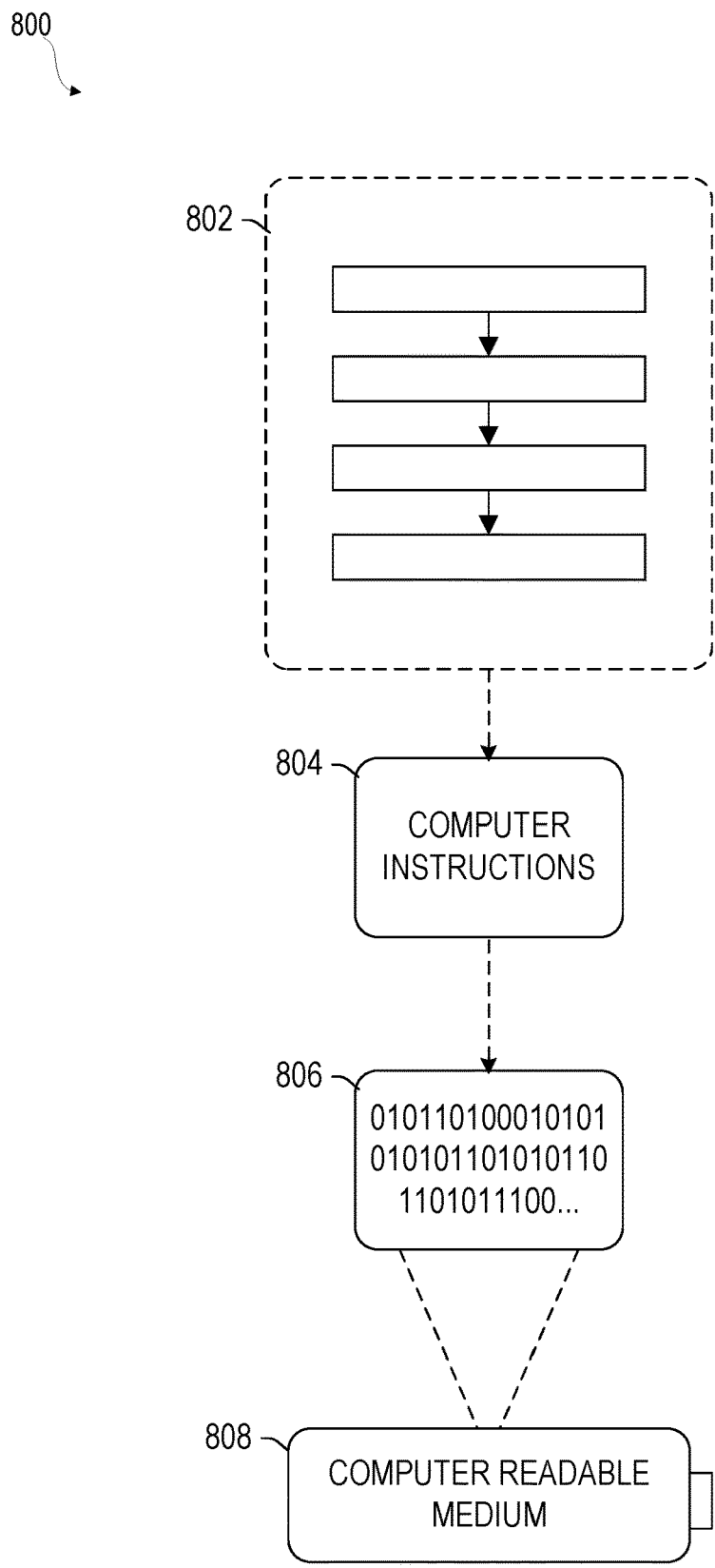
FIG. 8 illustrates a block diagram of example computer-readable medium or computer-readable device including processor-executable instructions configured to embody one or more of the provisions set forth herein, according to one or more embodiments.

Still another embodiment involves a computer-readable medium including processor-executable instructions configured to implement one or more embodiments of the techniques presented herein. An embodiment of a computer-readable medium or a computer-readable device devised in these ways is illustrated in FIG. 8, wherein an implementation 800 includes a computer-readable medium 808, such as a CD-R, DVD-R, flash drive, a platter of a hard disk drive, etc., on which is encoded computer-readable data 806. This computer-readable data 806, such as binary data including a plurality of zero's and one's as shown in 806, in turn includes a set of computer instructions 804 configured to operate according to one or more of the principles set forth herein. In one such embodiment 800, the processor-executable computer instructions 804 may be configured to perform a method 802, such as methods 600, 700 of FIGS. 6-7. In another embodiment, the processor-executable instructions 804 may be configured to implement a system, such as the apparatus 100 of FIG. 1. Many such computer-readable media may be devised by those of ordinary skill in the art that are configured to operate in accordance with the techniques presented herein.

Figure 9:
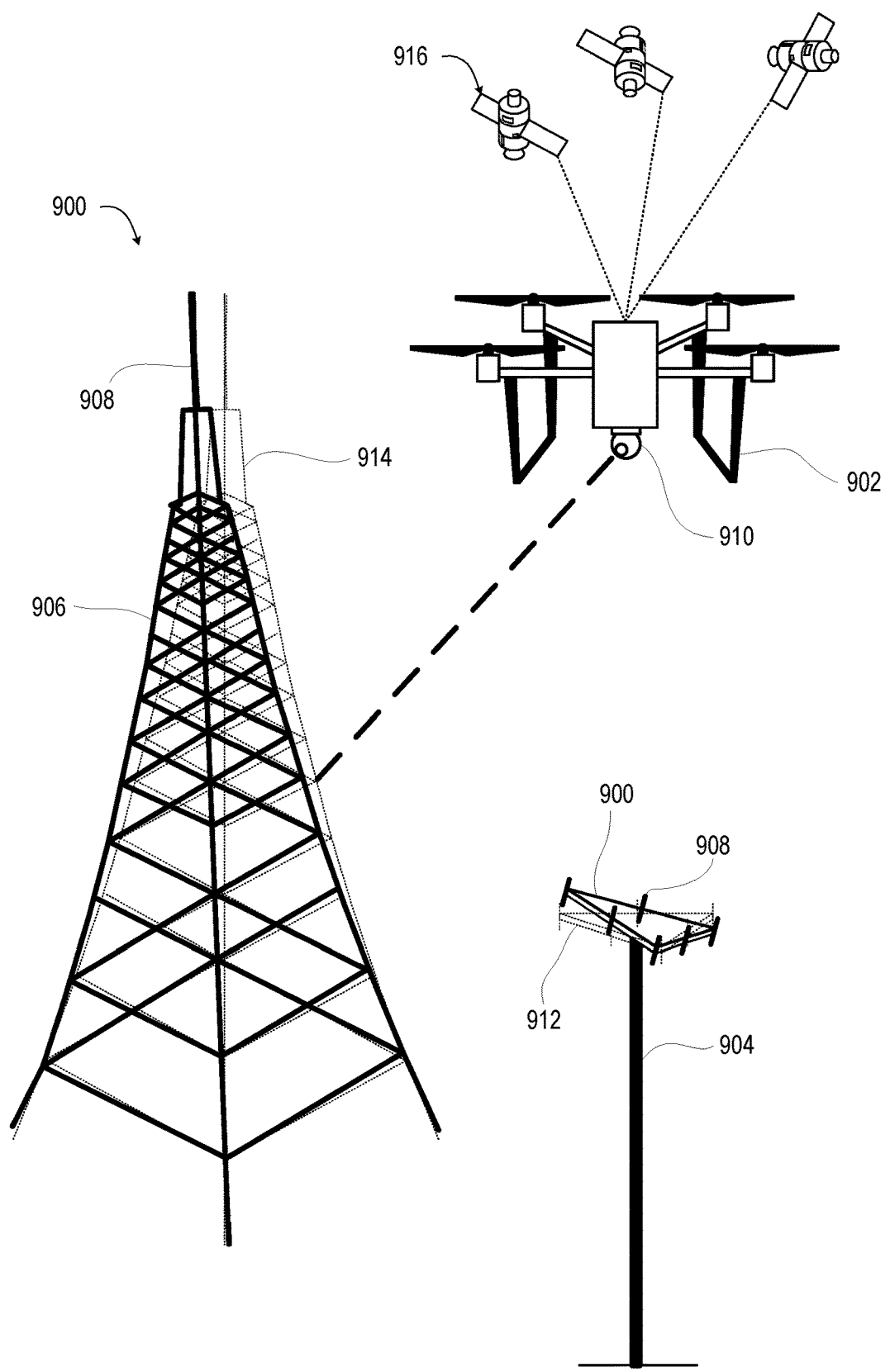
FIG. 9 illustrates a scenario of an aerial drone 3D scanning a communication tower as part of regular inspection, according to one or more embodiments.

In one or more embodiments, FIG. 9 illustrates an outdoor scenario 900 wherein 3D scanning equipment such as aerial drone 902 can be usable on large structures such as for inspection of cell towers 904, broadcast towers 906. The 3D scan data can be used for the required twice annual inspections to confirm that alignment of the tower 904, 906 and attached antennae 908 are providing a best field of view/reception. Aerial drone 902 can have one or more scanning devices 910 that use Lidar, laser, computed tomography (CT), or photogrammetry, etc., to get 3D model. Aerial drone 902 can geospatially orient the new 3D scan data to a prior 3D scan 912, 914 respectively. In one or more embodiments, aerial drone 902 obtains further orientation information such as via a global positioning system (GPS) satellite array 916.

Conditions for Congruence of Triangles

For clarity, one or more of the disclosed embodiments refer to picking a reference triangle, finding three adjacent triangles that share the three sides of the reference triangle, calculating the total perimeter of the perimeters of the three adjacent triangles, then comparing. According to aspects of the present disclosure, other ones of the basic geometry principles of Conditions for Congruence of Triangles may also be used:
  (i) Side-Side-Side (SSS);
  (ii) Side-Angle-Side (SAS);
  (iii) Angle-Side-Angle (ASA);
  (iv) Angle-Angle-Side (AAS); and
  (v) Right angle-Hypotenuse-Side (RHS).
  b) Instead of SSS for the one or more adjacent triangles, a combination of one or more of the Conditions for Congruence of Triangles may be used for the one or more reference triangles. Measurement may extend to adjacent triangles to adjacent triangles.

Triangle Hashing Schemes: Given a triangle mesh, a hash value is assigned to each triangle. The hash is a number that describes several local geometric properties of the mesh nearby the triangle. In general, a hashing scheme should satisfy the following requirements:
  (i) Local geometry encoding: The hash is a function of the geometric measurements of a patch of mesh surrounding the triangle within a small, fixed topological or geometry distance from the triangle.
  (ii) Isometric Independence: The hash should not depend on the position or orientation of the triangle in space, but only on its shape and the relative positions of nearby triangles and their vertices.
  (iii) Invertible hash: The geometric measurements recorded form a one-to-one correspondence with hashes, so that the geometric measurements can be recovered from the hash value alone.

Figure 10:
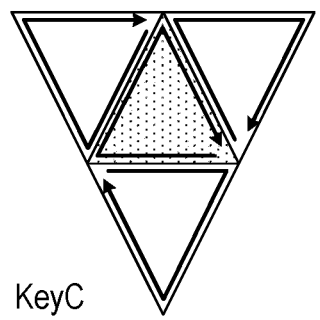
FIG. 10 illustrates KeyC facet neighbor edge hashing, according to one or more embodiments.

Facet Neighbor Edge Hashing: In one or more embodiments, the present disclosure includes using one or more types of facet neighbor edge hashing such as Key4, KeyE/Key10, KeyV and KeyC. FIG. 10 depicts KeyC facet neighbor edge hashing. KeyC is provided by a function: Round (Sum (perimeter+[adjacent perimeters]), 2). KeyC is a summing up the edge lengths of the triangle and its neighbor.

An example of a method for performing KeyC is provided in the following:
  A method for comparing two or more three-dimensional (3D) object models comprising:
    i) receiving polygonal (e.g., triangular) mesh data describing two or more three-dimensional (3D) object models;
    ii) assigning one of the two or more three-dimensional (3D) object models as a reference object;
    iii) evaluating at least one 3D triangle from each received polygonal (e.g., triangular) mesh data of the two or more three-dimensional (3D) object models as a reference polygon, and for each reference triangle: (i) identifying one or more adjacent triangles (or other polygon) that share a side with the reference triangle; (ii) calculating a total perimeter value for a length of the perimeters of the one or more adjacent triangles (or other polygon); and (iii) assigning the total perimeter value to the reference triangle (or polygon);
    iv) comparing the total perimeter values assigned to one or more 3D object models to the total perimeter values assigned to the reference object; and
    v) determining whether a match exists between one or more three-dimensional (3D) object models and the reference object based upon an amount of matching of obtained total perimeter values.

Another example of a method for performing KeyC is provided in the following:
  A method for comparing two or more three-dimensional (3D) object models comprising:
    i) receiving triangular mesh data describing two or more three-dimensional (3D) object models;
    ii) assigning one of the two or more three-dimensional (3D) object models as a reference object;
    iii) evaluating at least one 3D triangle from each received triangular mesh data of the two or more three-dimensional (3D) object models as a reference triangle, and for each reference triangle: (i) identifying three adjacent triangles that share a side with the reference triangle; (ii) calculating a total perimeter value for a length of the perimeters of the three adjacent triangles; and (iii) assigning the total perimeter value to the reference triangle;
    iv) comparing the total perimeter values assigned to one or more 3D object models to the total perimeter values assigned to the reference object; and
    v) determining whether a match exists between one or more three-dimensional (3D) object models and the reference object based upon an amount of matching of obtained total perimeter values.

Figure 11:
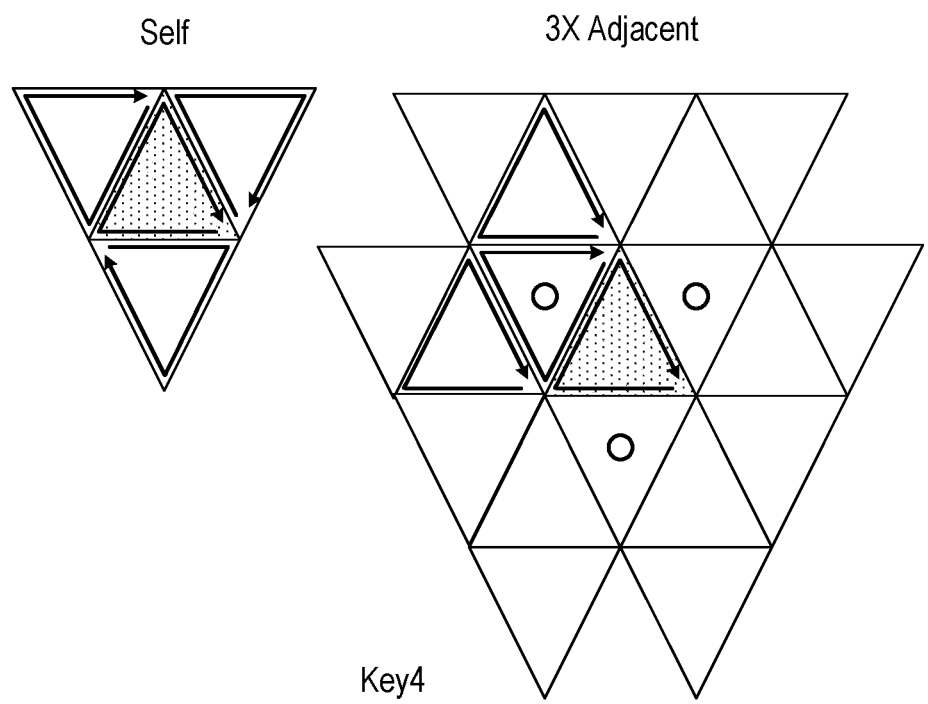
FIG. 11 illustrates Key4 facet neighbor edge hashing, according to one or more embodiments.

FIG. 11 depicts Key4 facet neighbor edge hashing. Key4 is provided by the function Tuple (KeyC, KeyC_a1, KeyC_a2, KeyC_a3), where the suffixes "a1", "a2" and "a3" denote respective adjacent triangles. Combining the KeyC score of the triangle with those of its neighbors into a sorted set provides Key4. Key4 was found to be effective for search/compare applications. An example of Key4 is provided by the following method:
  A method for comparing two or more three-dimensional (3D) objects comprising:
    i) receiving triangular mesh data describing the two or more three-dimensional (3D) objects;
    ii) evaluating at least one 3D triangle from each of the received triangular mesh data of the two or more three-dimensional 3D objects as a reference triangle, and for each triangle:
      (a) identifying two or more adjacent triangles that share a side with the reference triangle;
      (b) calculating a total perimeter value for a length of the perimeters of the two or more adjacent triangles; and
      (c) assigning the total perimeter value to the reference triangle;
    iii) comparing the total perimeter values assigned to the 3D object to total perimeter values assigned to a reference three-dimensional (3D) object; and
    iv) determining whether a match exists between the two or more three-dimensional (3D) objects 3D based upon an amount of matching of obtained total perimeter values.

Key4++ is a facet neighbor edge hashing improvement on Key 4 by extending the numerical dynamic range and making precision configurable. Instead of storing the perimeter sums, the method evaluates the exponent of the largest sum and the mantissa of each of the 4 sums. This produces a set of five integers for each triangles that can be encoded into single a 64-bit integer. This integer can be compared with those produced from other triangles to identify matching geometry. The precision of the method can be adapted by controlling the number of significant bits in the perimeter sum mantissas. An example Key4++ function is a 64-bit integer (key_exponent, mantissa_uKeyC, mantissa_a1, mantissa_a2, mantissa_a3) where uKeyc, uKeyC_a1, uKeyC_a2, uKeyC_a3 are as defined in Key4 but with no digit founding applied. Key_exponent is the 11-bit exponent of max(uKeyC, uKeyC_a1, uKeyC_a2, uKeyC_a3). mantissa_* is the 13-bit mantissa (significant digit part) of uKeyc, uKeyC_a1, uKeyC_a2, uKeyC_a3 respectively.

Figure 12:
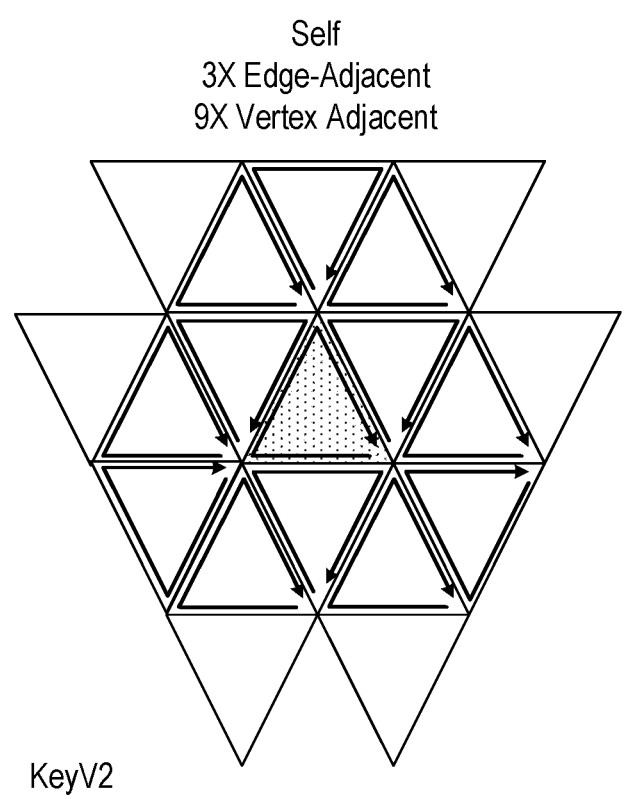
FIG. 12 illustrates KeyV2 facet neighbor edge hashing, according to one or more embodiments.

FIG. 12 depicts KeyV2 facet neighbor edge hashing. KeyV2 is provided by the function Sum (perimeter+[edge-adjacent perimeters]+[vertex-adjacent perimeters]). An example of a method using KeyV2 is the method described above for Key4 with the additional features:
  For each 3D triangle of the received triangular mesh data of the 3D object evaluated as a reference triangle, identifying three adjacent triangles that share a side with the reference triangle and any other triangles sharing a vertex with the reference triangle:
(a) calculating a total perimeter value for the length of the perimeters of the three adjacent triangles and any other triangles sharing a vertex; and
(b) assigning the total perimeter value to the reference triangle;
(c) comparing the total perimeter values assigned to the 3D object to total perimeter values assigned to the reference object; and
(d) determining whether a match exists between the 3D object and the reference object based upon an amount of matching of the obtained total perimeter values.

Figure 13:
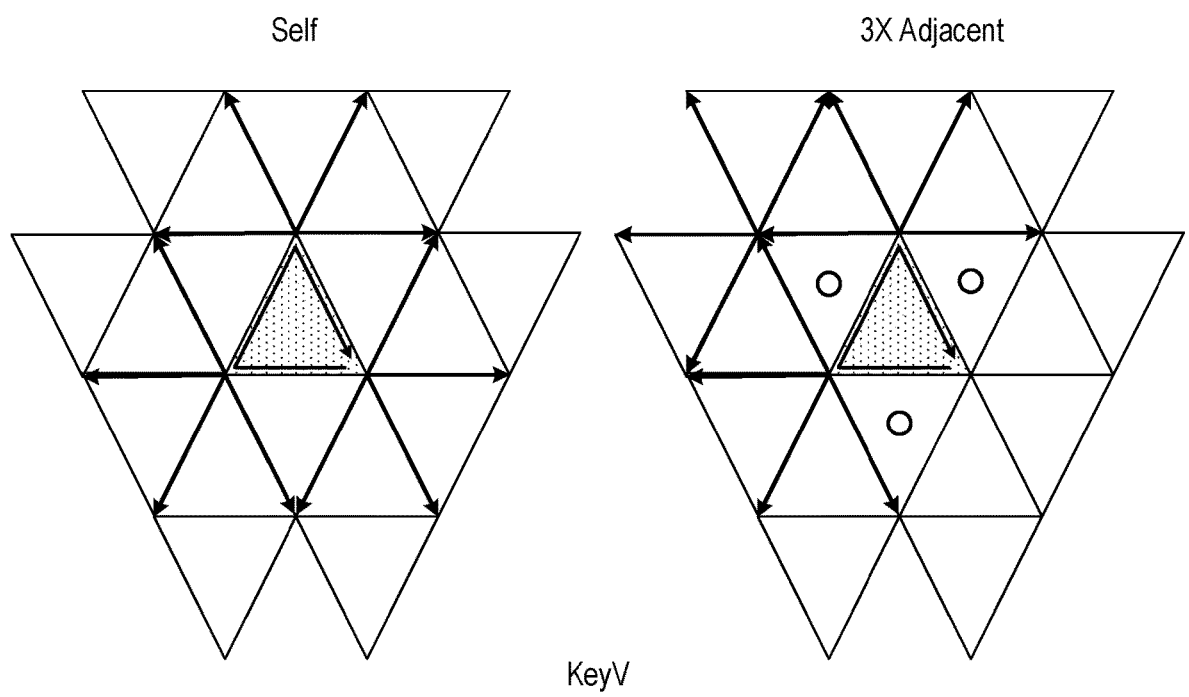
FIG. 13 illustrates KeyV facet neighbor edge hashing, according to one or more embodiments.

FIG. 13 depicts KeyV facet neighbor edge hashing. KeyV is provided by the following function: KevV_a=Round (perimeter+[vertex edge lengths], 2) Tuple(KeyVa, KeyVa1, KeyVa2, KeyVa3). For a single triangle sum, its edges and the edges starting at its vertices. This sum is concatenated for the triangle and its 3 neighbors.

Figure 14:
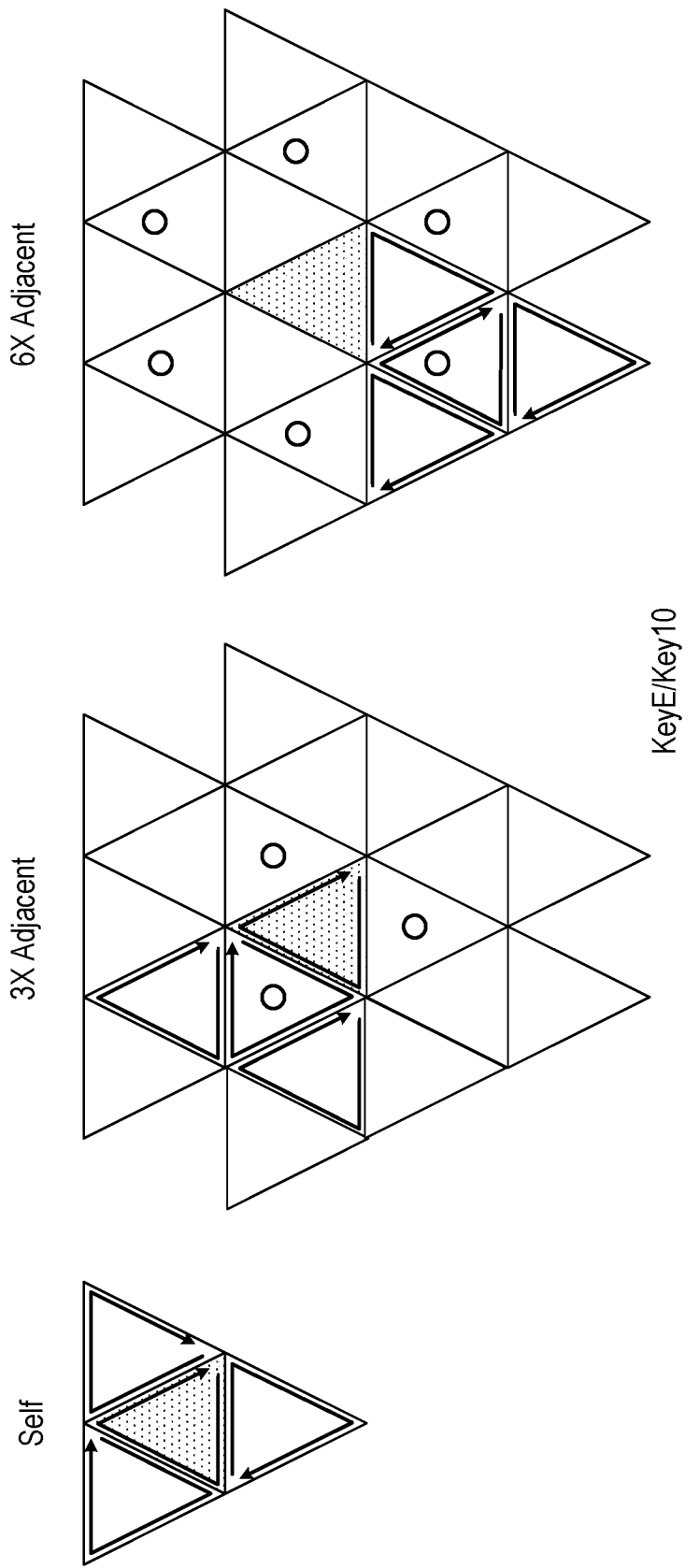
FIG. 14 illustrates depicts KeyE or Key10 facet neighbor edge hashing, according to one or more embodiments.

FIG. 14 depicts KeyE or Key10 facet neighbor edge hashing. KeE or Key10 is a face neighbor edge hashing that extends the concept of KeyC to a next order of triangle adjacently: Tuple (KeyC, KeyC_a1, KeyC_a11, keyC_a12, KeyC_a2, KeyC_a21, KeyC_a22, KeyC_a3, KeyC_a31, KeyC_a32)).

Curvature Hashing: The present disclosure extends the concept of extracting numerical properties from groups of neighboring triangles. The Gaussian curvature of a surface is a mathematical measurement of the rate of directional change along a surface. This method approximates the Gaussian curvature of a surface at a triangle and multiplies it with the area to obtain an area normalized Gaussian curvature. This value is used combined with perimeters of the neighboring triangles to create a triangle signature (also known as a hash value). The Key4 method uses the perimeter lengths of triangles to determine a unique signature. This method creates an additional signature which also captures information about the angular change of neighboring triangles, which is then used for similar applications.

The afore-mentioned techniques and method describe ways in which local geometry markers can be extracted from a triangle and its neighbors to uniquely encode the local shape of the object. According to further aspects of the present disclosure, a method computes a code (single number or set of numbers) that stems from the analysis of a reference triangle and its neighboring triangles in a 3D mesh, such that this code represents a numeric value for the localized shape/geometry of the mesh.

Calculate Geometric Content that was added or removed (i.e., when comparing two 3D objects where one is a revision of the other): Use the reference triangle sums to determine what content was removed or added in the revised version of the 3D object. One or more of the neighbor edge hashing techniques may be used. In an example, at a first time, a method includes scanning an object to obtain first triangular mesh data. At a second time, the method includes scanning the object to obtain second triangular mesh data. The method includes determining whether the match exists between the 3D object based on the second triangular mesh data and the reference object based on the first triangular mesh data based upon the amount of matching of the obtained total perimeter values.

Mesh Transform Computation: Using the one-to-one mapping between triangles in a mesh object and a subject mesh, the methods described herein can be used to compute the translation or rotation of the entire or portions of the mesh (i.e., "deviations"). When two meshes have significant similar triangles, the two meshes may be easily aligned three-dimensional space with the benefit of the present disclosure. The matching triangles are computed between the two meshes which match exactly once using one or more of the facet neighbor edge hashing techniques described herein. The center points of the triangles are then extracted so that an exact correspondence is created between the locations of the matching triangles of the first and second meshes. The best fit rigid affine transformation are computed that aligns the matching triangles.

When two meshes have many significantly similar subparts, find many alignments between the two meshes with similar mesh parts match. First, the matching triangle hashes are computed between the two meshes in local patches. Then, the best fit rigid linear transformation are computed that aligns the matching triangles. A check is made of the overlap to rank the transformations. Going beyond a percentage match, aspects of the present disclosure include additionally computing the rigid affine transformation in three space which optimally aligns the matching subparts.

Mesh Distance Computation: Using the one-to-one mapping between triangles in a mesh object and a subject mesh, the methods described herein can be used to compute the distance of surface elements between two triangles meshes that have identical triangles. In one or more embodiments, the Hausdorff distance is used in determining this deviation and can be used on any objects described by a triangle mesh.

3D Search: A search index may be constructed using the techniques described herein. the search index allows for accurate retrieval of similar or derived shapes in a database.

Figure 15:
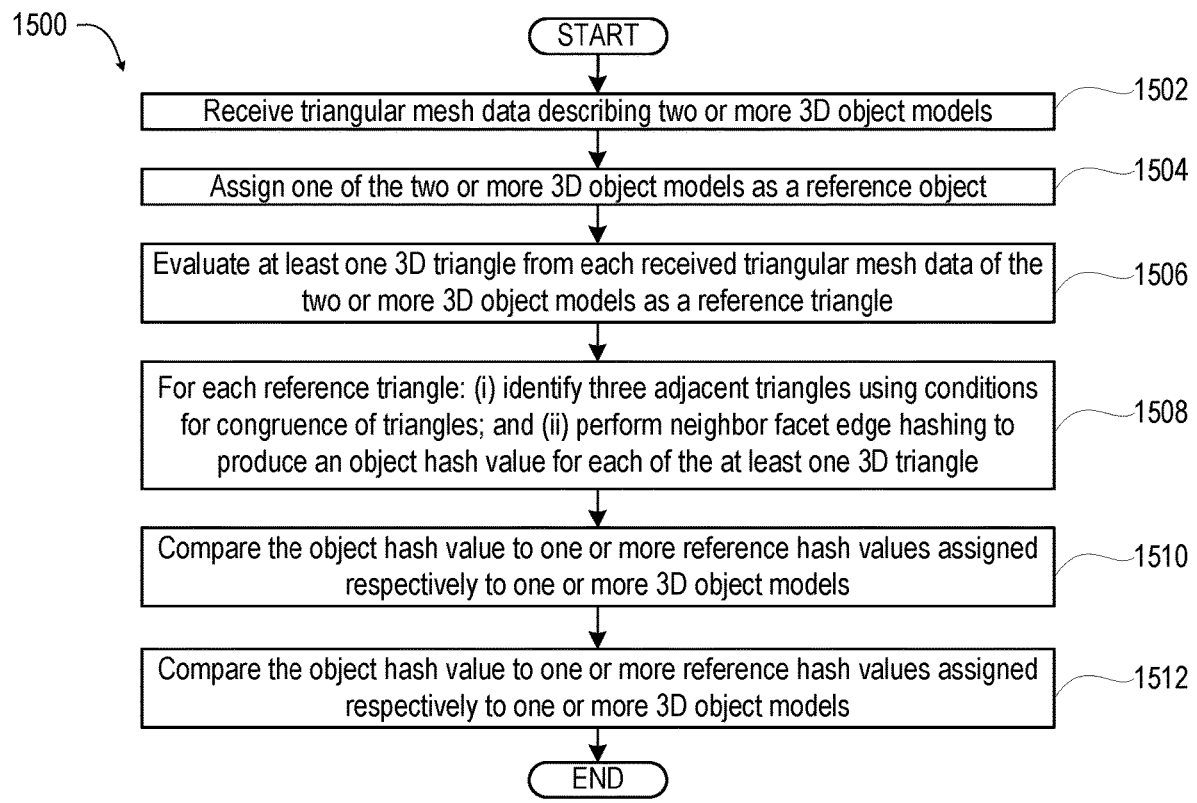
FIG. 15 illustrates a flow diagram presenting an example method for comparing two or more three-dimensional (3D) object models, according to one or more embodiments.

FIG. 15 is a flow diagram present an example method 1500 for comparing two or more three-dimensional (3D) object models. In one or more embodiments, the method 1500 includes receiving triangular mesh data describing two or more 3D object models (block 1502). The method 1500 includes assigning one of the two or more 3D object models as a reference object (block 1504). The method 1500 includes evaluating at least one 3D triangle from each received triangular mesh data of the two or more 3D object models as a reference triangle (block 1506). The method 1500 includes, for each reference triangle: (i) identifying two or more adjacent triangles using conditions for congruence of triangles; and (ii) performing neighbor facet edge hashing to produce an object hash value for each of the at least one 3D triangle (block 1508). The method 1500 includes comparing the object hash value to one or more reference hash values assigned respectively to one or more 3D object models (block 1510). The method 1500 includes determining whether a match exists between one or more 3D object models and the reference object based upon an amount of matching of obtained hash values (block 1512). Then method 1500 ends.

In one or more embodiments, the conditions for congruence of triangles comprises one or more of: (i) Side-Side-Side (SSS); (ii) Side-Angle-Side (SAS); (iii) Angle-Side-Angle (ASA); (iv) Angle-Angle-Side (AAS); and (v) Right Angle-Hypotenuse-Side (RHS). In one or more embodiments, the neighbor facet edge hashing comprises a KeyC technique comprising summing a perimeter length of edges of a triangle and of three neighbor triangles. In one or more particular embodiments, the neighbor facet edge hashing further includes performing a Key4 technique combining KeyC scores for the triangle and the three neighbors into a sorted set. In one or more specific embodiments, the method 1500 includes performing a Key4++ technique for extending numerical dynamic range and making configurable precision configurable by evaluating an exponent of a largest sum and a mantissa of each of four sums produced by the Key4 technique to produce a set of five integers.

In one or more embodiments, the method 1500 includes performing a KeyE/Key10 technique by extending the KeyC to a next order of adjacent triangles. In one or more embodiments, the neighbor facet edge hashing comprises KeyV2 technique comprises summing a perimeter length of the triangle, edge adjacent perimeters, and vertex-adjacent perimeters. In one or more embodiments, the neighbor facet edge hashing comprises KeyV technique comprises summing a perimeter length of the triangle and edges of vertex-adjacent triangles. In one or more embodiments, the method 1500 further includes performing Gaussian curvature adjustment to the 3D triangular mesh data. In one or more embodiments, the method 1500 includes searching a database of more than one 3D triangular mesh data to find matches based on a pattern of hash values. Then method 1500 ends.

Figure 16:
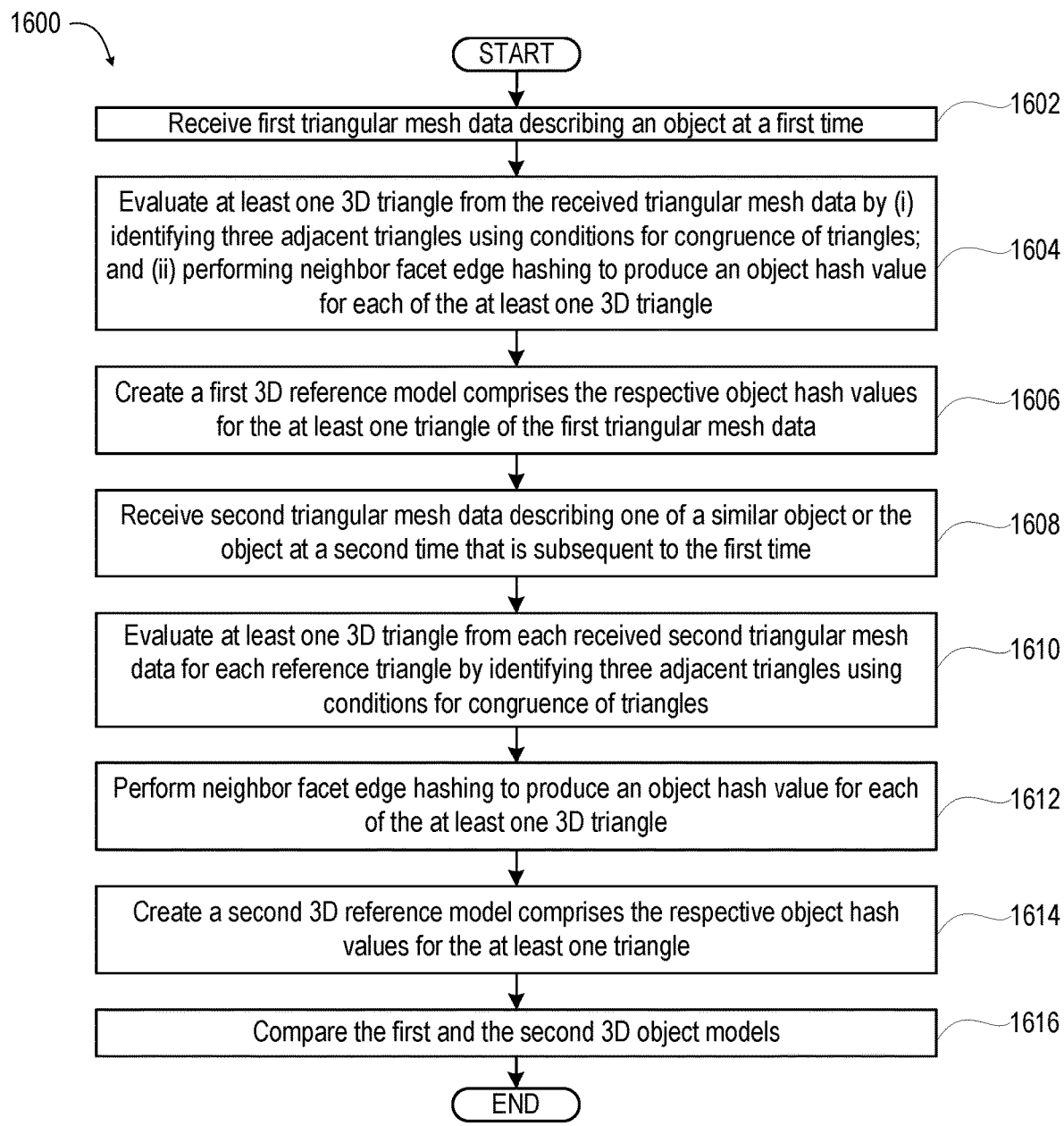
FIG. 16 illustrates a flow diagram presenting an example method for identifying deviations in an object, according to one or more embodiments.

FIG. 16 is a flow diagram presenting a method 1600 for identifying deviations in an object. In one or more embodiments, the method includes receiving first triangular mesh data describing an object at a first time (block 1602). The method 1600 includes evaluating at least one 3D triangle from the received triangular mesh data by (i) identifying two or more adjacent triangles using conditions for congruence of triangles; and (ii) performing neighbor facet edge hashing to produce an object hash value for each of the at least one 3D triangle (block 1604). The method 1600 includes creating a first 3D reference model comprises the respective object hash values for the at least one triangle of the first triangular mesh data (block 1606). The method 1600 includes receiving second triangular mesh data describing one of a similar object or the object at a second time that is subsequent to the first time (block 1608). The method 1600 includes evaluating at least one 3D triangle from each received second triangular mesh data for each reference triangle by identifying two or more adjacent triangles using conditions for congruence of triangles (block 1610). Method 1600 includes performing neighbor facet edge hashing to produce an object hash value for each of the at least one 3D triangle (block 1612). Method 1600 includes creating a second 3D reference model comprises the respective object hash values for the at least one triangle (block 1614). Method 1600 includes comparing the first and the second 3D object models (block 1616). Then method 1600 ends.

In one or more embodiments, the method 1600 includes determining at least one of sub-objects that is added or removed based on comparing the first and the second 3D object models. In one or more embodiments, the method 1600 includes determining at least one of sub-objects that is one or more of translated and rotated based on comparing the first and the second 3D object models. In one or more embodiments, the method 1600 includes extracting a center point for each at least one 3D triangle; and performing best fit rigid affine transformations to align the first and the second 3D object models. In one or more embodiments, the method 1600 includes determining Hausdorff distance to determine deviations between features of the first and the second 3D object models.

At least a portion of the devices and/or processes described herein can be integrated into a data processing system with a reasonable amount of experimentation. Those having skill in the art will recognize that a typical data processing system generally includes one or more of a system unit housing, a video display device, memory, processors, operating systems, drivers, graphical user interfaces, and application programs, interaction devices such as a touch pad or screen, and/or control systems including feedback loops and control motors. A typical data processing system may be implemented utilizing any suitable commercially Accordingly, the presently described system may comprise a plurality of various hardware and/or software components such as those described below. It will be appreciated that for ease of description, the variously described hardware and software components are described and named according to various functions that it is contemplated may be performed by one or more software or hardware components within the system. However, it will be understood that the system may incorporate any number of programs configured to perform any number of functions including, but in no way limited to those described below. Furthermore, it should be understood that while, for ease of description, multiple programs and multiple databases are described, the various functions and/or databases may, in fact, be part of a single program or multiple programs running in one or more locations.

Where databases are described, it will be understood by one of ordinary skill in the art that (i) alternative database structures to those described may be readily employed, and (ii) other memory structures besides databases may be readily employed. Any illustrations or descriptions of any sample databases presented herein are illustrative arrangements for stored representations of information. Any number of other arrangements may be employed besides those suggested by, e.g., tables illustrated in drawings or elsewhere. Similarly, any illustrated entries of the databases represent exemplary information only; one of ordinary skill in the art will understand that the number and content of the entries can be different from those described herein. Further, despite any depiction of the databases as tables, other formats (including relational databases, object-based models and/or distributed databases) are well known and could be used to store and manipulate the data types described herein. Likewise, object methods or behaviors of a database can be used to implement various processes, such as the described herein. In addition, the databases may, in a known manner, be stored locally or remotely from any device(s), which access data in the database.

Although process steps, algorithms or the like may be described in a sequential order, such processes may be configured to work in different orders. In other words, any sequence or order of steps that may be explicitly described does not necessarily indicate a requirement that the steps be performed in that order. On the contrary, the steps of processes described herein may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the invention, and does not imply that the illustrated process is preferred. Although a process may be described as including a plurality of steps, that does not imply that all or any of the steps are essential or required. Various other embodiments within the scope of the described invention(s) include other processes that omit some or all of the described steps. Unless otherwise specified explicitly, no step is essential or required.

In an exemplary system within a computing environment for implementing the invention includes a general-purpose computing device in the form of a computing system, commercially available from Intel, IBM, AMD, Motorola, Cyrix and others. Components of the computing system may include, but are not limited to, a processing unit, a system memory, and a system bus that couples various system components including the system memory to the processing unit. The system bus may be any of several types of bus structures including a memory bus or memory controller, a peripheral bus, and a local bus using any of a variety of bus architectures. Computing system typically includes a variety of computer readable media. Computer readable media can be any available media that can be accessed by the computing system and includes both volatile and nonvolatile media, and removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data.

Computer memory includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing system. The system memory includes computer storage media in the form of volatile and/or nonvolatile memory such as read only memory (ROM) and random-access memory (RAM). A basic input/output system (BIOS), containing the basic routines that help to transfer information between elements within computing system, such as during start-up, is typically stored in ROM. RAM typically contains data and/or program modules that are immediately accessible to and/or presently being operated on by processing unit. By way of example, and not limitation, an operating system, application programs, other program modules and program data are shown.

Computing system may also include other removable/non-removable, volatile/nonvolatile computer storage media. By way of example only, a hard disk drive that reads from or writes to non-removable, nonvolatile magnetic media, a magnetic disk drive that reads from or writes to a removable, nonvolatile magnetic disk, and an optical disk drive that reads from or writes to a removable, nonvolatile optical disk such as a CD ROM or other optical media could be employed to store the invention of the present embodiment. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive is typically connected to the system bus through a non-removable memory interface such as interface, and magnetic disk drive and optical disk drive are typically connected to the system bus by a removable memory interface, such as interface.

The drives and their associated computer storage media, discussed above, provide storage of computer readable instructions, data structures, program modules and other data for the computing system. For example, hard disk drive is illustrated as storing operating system, application programs, other program modules and program data. Note that these components can either be the same as or different from operating system, application programs, other program modules, and program data. Operating system, application programs, other program modules, and program data are given different numbers hereto illustrates that, at a minimum, they are different copies.

A user may enter commands and information into the computing system through input devices such as a tablet, or electronic digitizer, a microphone, a keyboard, and pointing device, commonly referred to as a mouse, trackball, or touch pad. These and other input devices are often connected to the processing unit through a user input interface that is coupled to the system bus but may be connected by other interface and bus structures, such as a parallel port, game port or a universal serial bus (USB). A monitor or other type of display device is also connected to the system bus via an interface, such as a video interface. The monitor may also be integrated with a touch-screen panel or the like. Note that the monitor and/or touch screen panel can be physically coupled to a housing in which the computing system is incorporated, such as in a tablet-type personal computer. In addition, computers such as the computing system may also include other peripheral output devices such as speakers and printer, which may be connected through an output peripheral interface or the like.

Computing system may operate in a networked environment using logical connections to one or more remote computers, such as a remote computing system. The remote computing system may be a personal computer, a server, a router, a network PC, a peer device or other common network node, and typically includes many or all of the elements described above relative to the computing system, although only a memory storage device has been illustrated. The logical connections depicted include a local area network (LAN) connecting through network interface and a wide area network (WAN) connecting via modem but may also include other networks. Such networking environments are commonplace in offices, enterprise-wide computer networks, intranets and the Internet.

For example, in the present embodiment, the computer system may comprise the source machine from which data is being migrated, and the remote computing system may comprise the destination machine. Note however that source and destination machines need not be connected by a network or any other means, but instead, data may be migrated via any media capable of being written by the source platform and read by the destination platform or platforms.

The central processor operating pursuant to operating system software such as IBM OS/2, Linux, UNIX, Microsoft Windows, Apple Mac OSX and other commercially available operating systems provides functionality for the services provided by the present invention. The operating system or systems may reside at a central location or distributed locations (i.e., mirrored or standalone). Software programs or modules instruct the operating systems to perform tasks such as, but not limited to, facilitating client requests, system maintenance, security, data storage, data backup, data mining, document/report generation and algorithms. The provided functionality may be embodied directly in hardware, in a software module executed by a processor or in any combination of the two. Furthermore, software operations may be executed, in part or wholly, by one or more servers or a client's system, via hardware, software module or any combination of the two. A software module (program or executable) may reside in RAM memory, flash memory, ROM memory, EPROM memory, EEPROM memory, registers, hard disk, a removable disk, a CD-ROM, DVD, optical disk, or any other form of storage medium known in the art. An exemplary storage medium is coupled to the processor such that the processor can read information from, and write information to, the storage medium. In the alternative, the storage medium may be integral to the processor. The processor and the storage medium may also reside in an ASIC. The bus may be an optical or conventional bus operating pursuant to various protocols that are well known in the art.

All publications, patents and patent applications cited herein, whether supra or infra, are hereby incorporated by reference in their entirety to the same extent as if each individual publication, patent or patent application was specifically and individually indicated as incorporated by reference. It should be appreciated that any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein, will only be incorporated to the extent that no conflict arises between that incorporated material and the existing disclosure material.

It must be noted that, as used in this specification and the appended claims, the singular forms "a," "an" and "the" include plural referents unless the content clearly dictates otherwise. Thus, for example, reference to a "colorant agent" includes two or more such agents.

Unless defined otherwise, all technical and scientific terms used herein have the same meaning as commonly understood by one of ordinary skill in the art to which the invention pertains. Although a number of methods and materials similar or equivalent to those described herein can be used in the practice of the present invention, the preferred materials and methods are described herein.

As will be appreciated by one having ordinary skill in the art, the methods and compositions of the invention substantially reduce or eliminate the disadvantages and drawbacks associated with prior art methods and compositions.

It should be noted that, when employed in the present disclosure, the terms "comprises," "comprising," and other derivatives from the root term "comprise" are intended to be open-ended terms that specify the presence of any stated features, elements, integers, steps, or components, and are not intended to preclude the presence or addition of one or more other features, elements, integers, steps, components, or groups thereof.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

While it is apparent that the illustrative embodiments of the invention herein disclosed fulfill the objectives stated above, it will be appreciated that numerous modifications and other embodiments may be devised by one of ordinary skill in the art. Accordingly, it will be understood that the appended claims are intended to cover all such modifications and embodiments, which come within the spirit and scope of the present invention.

What is claimed is:

1. A method for comparing two or more three-dimensional (3D) object models, the method comprising:
   i) receiving triangular mesh data describing two or more 3D object models;
   ii) assigning one of the two or more 3D object models as a reference object;
   iii) evaluating at least one 3D triangle from each received triangular mesh data of the two or more 3D object models as a reference triangle, and for each reference triangle: (i) identifying one or more adjacent triangles using conditions for congruence of triangles; and (ii) performing neighbor facet edge hashing to produce an object hash value for each of the at least one 3D triangle;
   iv) comparing the object hash value to one or more reference hash values assigned respectively to one or more 3D object models; and
   v) determining whether a match exists between one or more 3D object models and the reference object based upon an amount of matching of obtained hash values.

2. The method of claim 1, wherein the conditions for congruence of triangles comprises one or more of: (i) Side-Side-Side (SSS); (ii) Side-Angle-Side (SAS); (iii) Angle-Side-Angle (ASA); (iv) Angle-Angle-Side (AAS); and (v) Right angle-Hypotenuse-Side (RHS).

3. The method of claim 1, wherein the neighbor facet edge hashing comprises a KeyC technique comprising summing a perimeter length of edges of a triangle and of three neighbor triangles.

4. The method of claim 3, wherein the neighbor facet edge hashing further comprises performing a Key4 technique combining KeyC scores for the triangle and the three neighbors into a sorted set.

5. The method of claim 4, further comprising performing a Key4++ technique for extending numerical dynamic range and making configurable precision configurable by evaluating an exponent of a largest sum and a mantissa of each of four sums produced by the Key4 technique to produce a set of five integers.

6. The method of claim 3, further comprising performing a KeyE/Key10 technique by extending the KeyC to a next order of adjacent triangles.

7. The method of claim 1, wherein the neighbor facet edge hashing comprises KeyV2 technique comprises summing a perimeter length of the triangle, edge adjacent perimeters, and vertex-adjacent perimeters.

8. The method of claim 1, wherein the neighbor facet edge hashing comprises KeyV technique comprises summing a perimeter length of the triangle and edges of vertex-adjacent triangles.

9. The method of claim 1, further comprising performing Gaussian curvature adjustment to the 3D triangular mesh data.

10. The method of claim 1, further comprising:
    vi) searching a database of more than one 3D triangular mesh data to find matches based on a pattern of hash values.

11. A method for identifying deviations in an object, the method comprising:
    i) receiving first triangular mesh data describing an object at a first time;
    ii) evaluating at least one 3D triangle from the received triangular mesh data by (i) identifying one or more adjacent triangles using conditions for congruence of triangles; and (ii) performing neighbor facet edge hashing to produce an object hash value for each of the at least one 3D triangle;

iii) creating a first 3D reference model comprises the respective object hash values for the at least one triangle of the first triangular mesh data;

iv) receiving second triangular mesh data describing one of a similar object or the object at a second time that is subsequent to the first time;

v) evaluating at least one 3D triangle from each received second triangular mesh data for each reference triangle:
   (a) identifying one or more adjacent triangles using conditions for congruence of triangles;
   (b) performing neighbor facet edge hashing to produce an object hash value for each of the at least one 3D triangle;
   (c) creating a second 3D reference model comprises the respective object hash values for the at least one triangle; and vi) comparing the first and the second 3D object models.

12. The method of claim 11, further comprising determining at least one of sub-objects that is added or removed based on comparing the first and the second 3D object models.

13. The method of claim 11, further comprising determining at least one of sub-objects that is one or more of translated and rotated based on comparing the first and the second 3D object models.

14. The method of claim 11, further comprising:
   vii) extracting a center point for each at least one 3D triangle; and
   viii) performing best fit rigid affine transformations to align the first and the second 3D object models.

15. The method of claim 11, further comprising determining Hausdorff distance to determine deviations between features of the first and the second 3D object models.

* * * * *